(12) United States Patent
Shimada et al.

(10) Patent No.: US 7,239,013 B2
(45) Date of Patent: Jul. 3, 2007

(54) MULTILAYER WIRING BOARD, METHOD FOR PRODUCING THE SAME, SEMICONDUCTOR DEVICE AND RADIO ELECTRONIC DEVICE

(75) Inventors: Yasushi Shimada, Tsukuba (JP); Yoshitaka Hirata, Shimodate (JP); Hiroyuki Kuriya, Shimodate (JP); Kazuhisa Otsuka, Shimodate (JP); Masanori Yamaguchi, Tsukuba (JP); Yuichi Shimayama, Shimodate (JP); Ken Madarame, Yuki (JP); Etsuo Mizushima, Yuki (JP); Yuusuke Kondou, Shimodate (JP); Kazunori Yamamoto, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 144 days.

(21) Appl. No.: 10/521,470

(22) PCT Filed: May 30, 2003

(86) PCT No.: PCT/JP03/06860

§ 371 (c)(1),
(2), (4) Date: Jan. 18, 2005

(87) PCT Pub. No.: WO2004/010751

PCT Pub. Date: Jan. 29, 2004

(65) Prior Publication Data

US 2006/0063367 A1    Mar. 23, 2006

(30) Foreign Application Priority Data

| Jul. 18, 2002 | (JP) | 2002-209639 |
|---|---|---|
| Jul. 18, 2002 | (JP) | 2002-209650 |
| Sep. 4, 2002 | (JP) | 2002-259284 |
| Sep. 4, 2002 | (JP) | 2002-259291 |
| Nov. 7, 2002 | (JP) | 2002-324238 |

(51) Int. Cl.
*H01L 23/52* (2006.01)

(52) U.S. Cl. .................. 257/691; 257/664; 361/791

(58) Field of Classification Search ................ 257/664, 257/691, 700, 723, 724; 361/791, 805, 806, 361/818
See application file for complete search history.

(56) References Cited

U.S. PATENT DOCUMENTS 4,775,573 A    10/1988    Turek (Continued)

FOREIGN PATENT DOCUMENTS

JP    53-149673    12/1978

(Continued)

OTHER PUBLICATIONS

Electrical Properties of Buried Capacitor in Zero X-Y Shrinkage Multilayer Ceramic Substrate, Osama Inoue; Seiichi Nakatani; Junichi Kato; and Yutaka Taguchi vol. 4, No. 2(2001) pp. 145-149.

(Continued)

Primary Examiner—Phuc T. Dang
(74) Attorney, Agent, or Firm—Antonelli, Terry, Stout and Kraus, LLP.

(57) ABSTRACT

A multilayer wiring board exhibiting excellent moldability and having a capacitor where variation of capacitance is suppressed, its producing method, a semiconductor device mounting a semiconductor chip on the multilayer wiring board, and a radio electronic device mounting the semiconductor device.

47 Claims, 7 Drawing Sheets

U.S. PATENT DOCUMENTS

| | | |
|---|---|---|
| 5,010,641 A | 4/1991 | Sisler |
| 5,079,069 A | 1/1992 | Howard et al. |
| 5,155,655 A | 10/1992 | Howard et al. |
| 5,161,086 A | 11/1992 | Howard et al. |
| 5,162,977 A | 11/1992 | Paurus et al. |
| 5,800,575 A | 9/1998 | Lucas |
| 6,265,090 B1 | 7/2001 | Nishide et al. |
| 6,707,685 B2 * | 3/2004 | Kabumoto et al. ......... 361/794 |

FOREIGN PATENT DOCUMENTS

| | | |
|---|---|---|
| JP | 60-089912 | 5/1985 |
| JP | 01-189999 | 7/1989 |
| JP | 05-055079 | 3/1993 |
| JP | 05-283864 | 10/1993 |
| JP | 06-0512716 | 2/1994 |
| JP | 06-085462 | 3/1994 |
| JP | 06-164150 | 6/1994 |
| JP | 06-232005 | 8/1994 |
| JP | 06-82927 | 10/1994 |
| JP | 07-022725 | 1/1995 |
| JP | 07-183665 | 7/1995 |
| JP | 09-083147 | 3/1997 |
| JP | 09-148746 | 6/1997 |
| JP | 10-013036 | 1/1998 |
| JP | 10-098245 | 4/1998 |
| JP | 11-0177244 | 7/1999 |
| JP | 2000-030534 | 1/2000 |
| JP | 2000-133900 | 5/2000 |
| JP | 2000-133907 | 5/2000 |
| JP | 2000-269065 | 9/2000 |
| JP | 2000-277922 | 10/2000 |
| JP | 2001-068858 | 3/2001 |
| JP | 2002-009416 | 1/2002 |
| JP | 2002-016366 | 1/2002 |
| JP | 2002-043714 | 2/2002 |
| JP | 2002-097441 | 4/2002 |
| JP | 2002-185104 | 6/2002 |
| JP | 2002-280261 | 9/2002 |

OTHER PUBLICATIONS

Examination of the Built-in STO Film Capacitor Process Technology on Resin-Molded High Frequency MCM and the Capacitor Frequency Characteristics, Hiroji Yamada and Kiichi Yamashita col. 4 No. 7 (2001) p. 590-596.

Integration of Thin Film Passive Circuits Using High/Low Dielectric Constant Materials, P. Chahal; A. Haridass; A. Pham; R.R. Tummala; M.G. Allen; m. Swaminathan and J. Laskar, 1997 Electronic Components and Technology Conference pp. 739-744.

National Center for Manufacturing Sciences pp. 3-1-3-6.

S. K. Bhattacharya, et al., "Next generation integral passives: materials, processes, and integration of resistors and capacitors on PWB substrates", *Journal of Materials Science: Materials in Electronics*, vol. 11, pp. 253-268, 2000.

Japanese Official Action, for Application No. 2002-259284, dated Mar. 14, 2006.

Japanese Official Action, for Application No. 2002-259291, dated Mar. 28, 2006.

Japanese Official Action, for Application No. 2002-324238, dated Mar. 28, 2006.

Japanese Official Action dated Jun. 27, 2006, for Japanese Application No. 2002-259291.

Japanese Official Action, for Application No. 2002-324238, dated Jul. 25, 2006.

Korean Official Action, for Application No. 10-2005-7000717, dated Aug. 3, 2006.

Chinese Official Action dated Aug. 18, 2006, for Application No. 038170728.

* cited by examiner

MULTILAYER WIRING BOARD, METHOD FOR PRODUCING THE SAME, SEMICONDUCTOR DEVICE AND RADIO ELECTRONIC DEVICE

This application is a 371 of PCT/JP03/06860 filed May 30, 2003.

Technical Field

The present invention relates to a multilayer wiring board, a manufacturing method thereof, a semiconductor device in which a semiconductor chip is mounted on the multilayer wiring board, and a wireless electronic device on which the semiconductor device is mounted.

Background Art

In recent years, with the development of electronic devices, in addition to an improvement of performance of electronic parts, the demand of reductions in size and weight of the electronic parts becomes strict. In particular, in a mobile electronic device typified by a mobile phone, the demand is remarkable in pursuit of the convenience. Against such a background, a multilayer wiring board has been used to efficiently mount a semiconductor chip or a passive device. Up to now, high-density wiring such as reduction in wiring line width is mainstream. However, in order to reduce the number of parts to be mounted, passive parts typified by capacitors are required to be built in the wiring board.

As a technique that builds a capacitor in a multilayer wiring board, a technique that calcines a high-electric constant inorganic material to form a dielectric layer, a technique (for example, U.S. Pat. No. 5,162,977) that composites a high-dielectric inorganic material and a resin material to form a dielectric layer, a technique that forms a thin dielectric layer by using a process such as a sputtering process, and the like have been known.

The technique that calcines a high-dielectric inorganic material to form a dielectric layer includes an example in which a high-dielectric material suitable for simultaneous calcination of a high-dielectric material and a substrate insulating material is used (see Japanese Patent Publication No. 5-55079 and Journal of Japanese Institute of Electronics Packaging, Vol. 4, No. 2, pp. 145 to 149). The technique that forms a thin dielectric layer includes an example in which a capacitor is built in a resin substrate by applying a semiconductor sputter technique (see Journal of Japanese Institute of Electronics Packaging, Vol. 4, No. 7, pp. 590 to 596).

Since a multilayer wiring board using a technique that composites a high-dielectric inorganic material and a resin material to form a dielectric layer does not include a high-temperature calcining step and a sputter step, the multilayer wiring board is economically excellent. Composite materials consisting of a large number of high-dielectric inorganic materials and a large number of resins are proposed to be applied to multilayer wiring boards using resins (for example, see Journal of Materials Science: Materials in Electronics, Vol. 11, pp. 253 to 268). Methods of manufacturing capacitors in multilayer wiring boards change depending on compositions of materials to be used. The methods include a manufacturing method of a conventional multilayer wiring board (see Embedded Decoupling Capacitance Project Final Report 3-1 to 6 (National Center for Manufacturing Sciences)) and a manufacturing method of a multilayer wiring board using a high-dielectric material having photosensitivity (see "Integration of Thin Film Passive Circuits Using High/Low Dielectric Constant Materials", Electronic Components and Technology Conference (1997), pp. 739 to 744).

In a multilayer wiring board in which a capacitor using a resin composite material obtained by filling a high-dielectric filler as a high-dielectric material is built, when capacitors are laminated as core layers and symmetrically arranged, both the surfaces of each core layer must be patterned. However, since the capacitor using the resin composite material easily causes problems in breaking strength and processibility, both the sides of the core layer must be independently patterned and laminated to make the cost higher than that in manufacturing of a conventional multilayer wiring board. In addition, in the multilayer wiring board, when an insulating layer is used as a core layer, high-dielectric material layers which are symmetrically laminated with reference to the core layer are slightly warped. However, the high-dielectric material layers which are asymmetrically laminated are greatly warped. More specifically, it is very difficult to arrange a capacitor in an arbitrary layer except for a core layer to obtain a multilayer wiring board with a small warpage. Therefore, in a conventional technique, in order to solve the problem, capacitors must be symmetrically arranged with reference to a core layer to reduce the warpage of a wiring board.

However, a method that symmetrically arranges and laminates capacitors consisting of an expensive material to reduce warpage excessively requires capacitors is not economically good. Furthermore, the degree of freedom of design of a multilayer wiring board is limited.

A capacitance which is an important characteristic of a capacitor is in proportion to a specific inductive capacity, and is in inverse proportion to the thickness of a dielectric substance. More specifically, in order to increase the capacitance of the capacitor without changing the material, the thickness of the high-dielectric material must be reduced. In the conventional method described in the above documents, a high-dielectric material is decreased in thickness to deteriorate the handling properties of the material, a high manufacturing yield cannot be achieved. In addition, like a copper foil with adhesive agent serving as a built-up substrate material, a material obtained by casting a high-dielectric material onto a copper foil may also be known. However, the filling properties and the thickness control of an internal layer circuit pattern are posed as problems when the internal layer pattern is laminated and integrated with an internal circuit substrate.

A capacitance serving as an important characteristics of a capacitor is also in proportion to the area of a counter electrode of the capacitor. More specifically, the fluctuation in area of the counter electrode must be reduced to suppress the fluctuation of capacitance in manufacturing. However, in formation of a capacitor electrode opposing an insulating layer containing a high-dielectric material, when a method that etches a metal foil covering the insulating layer in the form of a desired pattern to form a capacitor electrode opposing an electrode formed in advance is used, the area of the counter electrode of the capacitor changes depending on the fluctuation of etching of the metal foil to fluctuate the capacitance of the capacitor. The fluctuation in capacitance of the capacitor caused by a shift of the counter electrode is also posed as a problem.

Furthermore, in a multilayer wiring board for a high-frequency circuit on which a large number of passive devices are mounted, a technique that efficiently builds inductors as passive devices except for capacitors in a substrate is also required. In the multilayer wiring board for a high-frequency circuit, a transmission loss is also required to be reduced.

DISCLOSURE OF THE INVENTION

According to a first aspect of the present invention, there is provided a multilayer wiring board including a plurality of insulating layers, a plurality of conductive layers, a conductive non-through hole for electrically connecting the plurality of conductive layers to each other, and a capacitor produced by forming electrodes on upper and lower surfaces of at least one insulating layer containing a high-dielectric material, wherein a hardened material of the high-dielectric material has a specific inductive capacity ranging from 20 to 100 at 25° C., 1 MHz, and a thickness ranging from 0.1 to 30 μm.

In the multilayer wiring board according to the first aspect of the present invention, a high-dielectric material layer serving as a dielectric substance of a capacitor is reduced in thickness to make it possible to reduce the warpage of the multilayer wiring board regardless of the symmetry or asymmetry of the layer structure. Furthermore, since a capacitor can be built in an arbitrary layer except for a core layer, the degree of freedom of design can be largely improved. Since the number of capacitors may be minimum, the cost can be reduced. Since a high-dielectric material is reduced in thickness, the capacitance of the capacitor which is in inverse proportion to the thickness of the dielectric material can be increased.

According to a second aspect of the present invention, there is provided a multilayer wiring board including a plurality of insulating layer, a plurality of conductive layers, a conductive non-through hole for electrically connecting the plurality of conductive layers to each other, and a capacitor produced by forming electrodes on upper and lower surfaces of at least one insulating layer containing a high-dielectric material, wherein an insulating material different from the high-dielectric material is filled in a recessed portion between conductive patterns including the electrodes, and the surfaces of the conductive patterns and the surface of the filled insulating material are planarized.

In a conventional capacitor-built-in multilayer wiring board, since an insulating resin is not filled in a recessed portion between conductive patterns, the thickness of the high-dielectric material layer having high elasticity increases in thickness. As a result, the fluctuation in capacitance of the capacitor tends to increase. In contrast to this, in a multilayer wiring board according to the second aspect of the present invention, the recessed portion between the conductive patterns is filled with an insulating resin in advance as described above to planarize the surface of the substrate on which the high-dielectric material layer is to be formed. For this reason, the high-dielectric layer can be reduced in thickness and formed with accuracy in thickness, and the fluctuation in capacitance of the capacitor can be reduced.

According to a third aspect of the present invention, there is provided a multilayer wiring board including a plurality of insulating layers, a plurality of conductive layers, a conductive hole for electrically connecting the conductive layers to each other, and a capacitor comprising at least one of the insulating layers containing a high-dielectric material having a specific inductive capacity ranging from 20 to 100 at 25° C., 1 MHz and produced by forming electrodes on upper and lower surfaces of the insulating layer, wherein at least one side of the counter electrodes has a thickness ranging from 1 to 18 μm.

In the multilayer wiring board according to the third aspect of the present invention, the thickness of the conductive layer is limited to improve patterning accuracy, and the fluctuation of etching can be reduced. Furthermore, the fluctuation in capacitance, a shift of position, the fluctuation in size can also be suppressed.

The present invention also provides a manufacturing method of a multilayer wiring board which includes a plurality of insulating layers, a plurality of conductive layers, a conductive non-through hole for electrically connecting the conductive layers to each other, and a capacitor produced by forming electrodes on upper and lower surfaces of at least one insulating layer containing a high-dielectric material, including: at least the step of forming conductive patterns including one of the electrodes; the step of filling and hardening an insulating material different from the high-dielectric material in a recessed portion between the conductive patterns; the step of planarizing the surfaces of the conductive patterns and the surface of the insulating material filled and hardened in the recessed portion between the conductive patterns by polishing; and the step of heating and laminating a metal foil having the high-dielectric material in a semi-hardened state.

The present invention still also provides a manufacturing method of a multilayer wiring board which includes a plurality of insulating layers, a plurality of conductive layers, a conductive hole for electrically connecting the plurality of conductive layers to each other, and a capacitor comprising at least one of the insulating layers containing a high-dielectric material having a specific inductive capacity ranging from 20 to 100 at 25° C., 1 MHz and produced by forming electrodes on upper and lower surfaces of the insulating layer, wherein, in formation of a conductive pattern, the same substrate is exposed a plurality of times such that a pattern exposure area of a photosensitive resist is set at 1 to 250 $cm^2$/time.

The present invention still also provides a semiconductor device wherein a semiconductor chip is mounted on the multilayer wiring board or a multilayer wiring board manufactured by the manufacturing method.

The present invention still also provides a wireless electronic device wherein the semiconductor device is mounted.

This application claims priorities based on Japanese Patent Applications previously applied by the present applicant, i.e., Japanese Patent Applications Nos. 2002-209639 (filing date: Jul. 18, 2002), 2002-209650 (filing date: Jul. 18, 2002), 2002-259284 (filing date: Sep. 4, 2002), 2002-259291 (filing date: Sep. 4, 2002), and 2002-324238 (filing date: Nov. 7, 2002). These specifications are incorporated in the application to refer to the specifications.

BEST MODE FOR CARRYING OUT THE INVENTION

Figure 1:
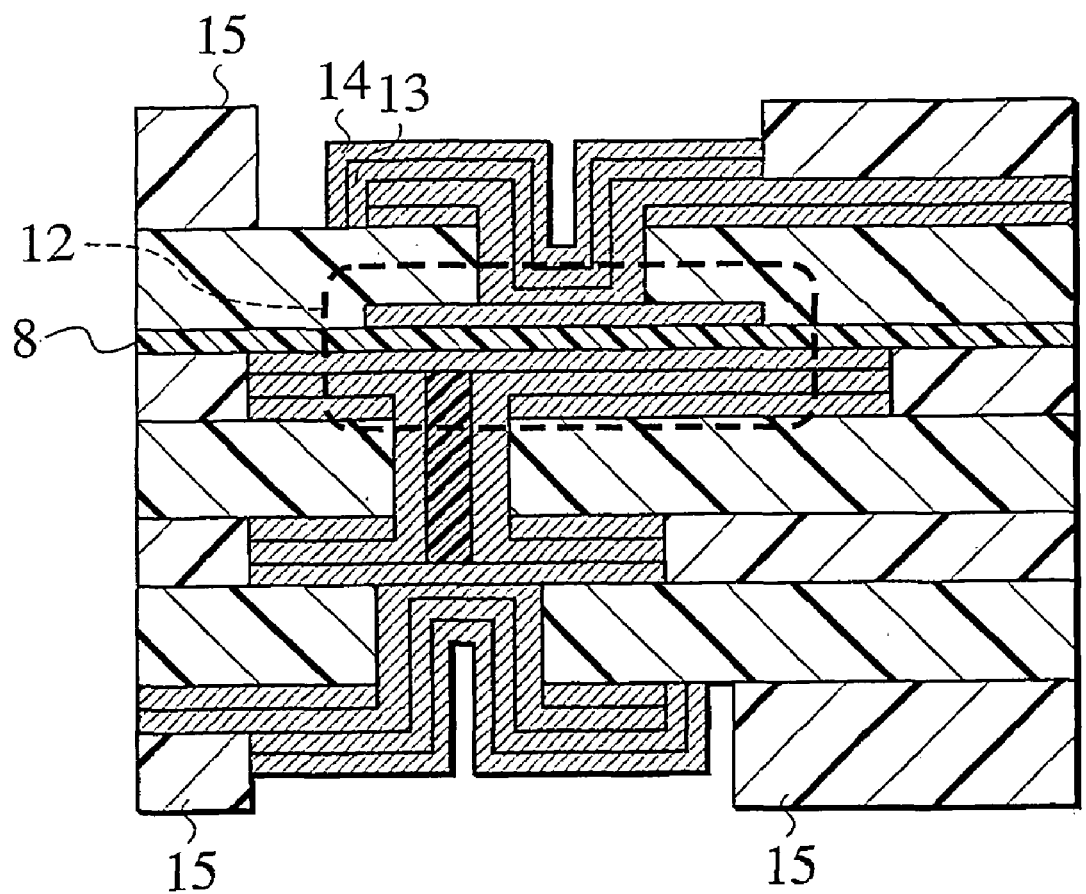
FIG. 1 is a sectional view showing an embodiment of a multilayer wiring board according to the present invention.

A high-dielectric material used in a capacitor of a multilayer wiring board according to the present invention is a resin compound including an insulating resin and a high-dielectric material filler. The insulating resin is not limited to a specific resin. However, as the insulating resin, an epoxy resin which can provide a high-dielectric material which can be used in a semi-hardened state and exhibits excellent insulating properties after hardening is preferably used.

As the epoxy resin, an epoxy resin which is hardened to achieve an adhesive function may be used. However, an epoxy resin preferably including two or more functional groups and a molecular weight of less than 5000, more preferably, less than 3000 is used. As a bifunctional epoxy resin, a bisphenol-A resin, a bisphenol-F resin, or the like is exemplified. The bisphenol-A liquid resin or the bisphenol-F liquid resin is commercially available as trade names: Epikote 807, Epikote 827, Epikote 828, from Yuka-Shell Epoxy Co. Ltd. From Dow Chemical Japan Ltd., resins are commercially available as trade names: D.E.R.330, D.E.R.331, and D.E.R.361. Furthermore, resins are commercially available as trade names YD8125 and YDF8170 from Toto Kasei Co., Ltd.

A multifunctional epoxy resin may be added to increase a glass-transition temperature. For example, a phenol-novolac-type epoxy resin, a cresol-novolac-type epoxy resin, or the like is exemplified. The phenol-novolac-type epoxy resin is commercially available as a trade name: EPPN-201 from Nippon Kayaku co., Ltd. The cresol-novolac-type epoxy resin is commercially available as a trade name: ESCN-190 or ESCN-195 from Sumitomo Chemical Co., Ltd. The cresol-novolac-type epoxy resin is commercially available as a trade name: EOCN1025 or EOCN1027 from Nippon Kayaku co., Ltd. In addition, the cresol-novolac-type epoxy resin is commercially available as a tradename: YDCN701, YDCN702, YDCN703, or YDCN704 from Toto Kasei Co., Ltd.

As a hardening agent for hardening the epoxy resin, an ordinary hardening agent can be used. The hardening agent is not limited to a specific hardening agent. For example, the hardening agent includes amine, polyamide, acid anhydride, polysulfide, boron trifluoride, or bisphenol A, bisphenol F, or bisphenol S serving as a compound containing two or more phenolic hydroxyl groups per molecule. In particular, Phenol resin, such as a phenol novolac resin, a bisphenol novolac resin, a cresol novolac resin, which is excellent in the electric corrosion resistance at the time of moisture absorption is preferably used. The preferable hardening agent is commercially available as a trade name: PLYOPHEN LF2882, PHENORITE TD-2090, PHENORITE TD-2149, PHENORITE VH4150, and PHENORITE VH4170 from Dainippon Ink And Chemicals, Incorporated.

Furthermore, a conventionally known hardening accelerator can be used together with the hardening agent. As the hardening accelerator, various imidazoles are preferably used. The imidazoles include, for example, 2-methylimidazole, 2-ethyl-4-methylimidazole, 1-cyanoethyl-2-phenylimidazole, 1-cyanoethyl-2-phenylimidazolium-trimellitate, and the like. These imidazoles are available as trade names: 2E4MZ, 2PZ-CN, and 2PZ-CNS from Shikoku Chemicals Corporation.

High-dielectric fillers include, for example, barium titanate, strontium titanate, calcium titanate, magnesium titanate, lead titanate, titanium dioxide, barium zirconate, calcium zirconate, lead zirconate, and the like. One of these high-dielectric fillers may be used, or two or more of these high-dielectric fillers may be used. In particular, a high-dielectric filler having a specific inductive capacity of 50 or more is preferably used. In addition, at least one of the high-dielectric fillers is preferably compounded 300 to 3000 parts by weight to an insulating resin of 100 parts by weight.

Furthermore, in order to improve the handling properties of the high-dielectric material used in the present invention, a high-molecular-weight resin having at least one functional group such as an epoxy group, an amide group, a carboxyl group, a cyanate group, or a hydroxy group and a weight-average molecular weight ranging from 10000 to 800000 is preferably mixed in the high-dielectric material. A high-molecular-weight resin having a weight-average molecular weight of 10000 or more can reduce tack properties of the high-dielectric material in B stage or improve flexibility in hardening. In addition, it is difficult that the high-dielectric filler having a weight-average molecular weight of larger than 800000 cannot be uniformly dispersed. Such high-molecular-weight resins include, for example, a phenoxy resin, a high-molecular-weight epoxy resin, a super-high-molecular-weight epoxy resin, a polyamide-imide resin, a reactive rubber containing a functional group, and the like. The phenoxy resin is commercially available as PHENOTOHTO YP-40 or PHENOTOHTO YP-50 from Toto Kasei Co., Ltd. The phenoxy resin is also commercially available as a trade name: PKHC, PKHH, or PKHJ from PHENOXY ASSOCIATE Corporation. The high-molecular-weight epoxy resins include a high-molecular-weight epoxy resin having a weight-average molecular weight of 30000 to 80000 and a super-weight-average-molecular weight having a weight-average molecular weight of larger than 80000 (see Japanese Patent Publication Nos. 7-59617, 7-59618, 7-59619, 7-59620, 7-64911, and 7-68327). Both the epoxy resins are manufactured in Hitachi Chemical Co., Ltd. The polyaimide-imide resin is commercially available as a trade name: KS9000 series from Hitachi Chemical Co., Ltd. As the reactive rubber containing a functional group, an acrylic rubber containing a carboxyl group is commercially available as a trade name: HTR-860P from Teikoku Chemical Industries Co., Ltd. or an acrylic rubber containing an epoxy group is commercially available as a trade name: HTR-860P-3 from Teikoku Chemical Industries Co., Ltd.

Furthermore, a dispersing agent may be added to the high-dielectric material used in the present invention. As a dispersing agent which can be used, a conventional known commercial non-silicone-based dispersing agent or the like can be used. The dispersing agent is not limited to a specific dispersing agent. In addition, a blending quantity of the dispersing agent may be appropriately determined by an experiment.

The high-dielectric material having the above-mentioned composition is mixed with an organic solvent such as methyl ethyl ketone to obtain a varnish-like solution. The solution is coated on a metal foil and dried in the form of a sheet in a B-stage state. The resultant sheet is preferably used. Metal foils to be used here include, for example, a copper foil and an aluminum foil. The thickness of the metal foil preferably ranges from 1 to 35 μm, more preferably ranges from 1 to 12 μm. However, in a multilayer wiring board according to the third aspect of the present invention, the thickness of at least one side of a metal foil serving as a conductive pattern including counter capacitor electrodes is set within the range of 1 to 18 μm. The metal foil is prevented from being meal-plated to make it possible to suppress an increase in thickness of the metal foil.

A melting viscosity of the high-dielectric material in the B-stage state at 120° C. preferably ranges from 100 to 200 Pa·S. When the minimum melting viscosity is lower than 100 Pa·S, a fluctuation in thickness is increased because a flow is large. When the melting viscosity is larger than 200 Pa·S, adhesion properties are deteriorated.

In the present invention, an insulating resin used in an insulating layer at a position except for an insulating layer including the high-dielectric material is not limited to a specific insulating resin. However, as the insulating resin, an insulating resin different from the high-dielectric material is preferably used. Furthermore, the insulating layer is reinforced by a glass substrate, and an inorganic filler is preferably added in the resin. When the insulating layer is reinforced by the glass substrate, even though the thickness of the insulating layer is 150 μm or more, the insulating layer can be controlled in thickness easier than an insulating layer which is not reinforced by a glass substrate. The inorganic filler is added to reduce undulation on the surface of the insulating layer caused by the influence of the glass substrate, and a multilayer wiring board having excellent high-frequency characteristics and a smooth surface can be obtained. As an insulating layer which is reinforced by a glass substrate and added with an inorganic filler, a commercial copper-clad lamination such as MCL-E-679F or MCL-BE-67G (H) (trade names available from Hitachi Chemical Co., Ltd.) or CS-3355S or CS-3357S (trade names available from RISHO KOGYO CO., LTD.) or an insulating material for interlayer adhesion such as GEA-679F or GEA-67BE (H) (trade names available from Hitachi Chemical Co., Ltd.) or ES-3305S (trade name available from RISHO KOGYO CO., LTD.).

The multilayer wiring board according to the present invention can also have an inductor together with a capacitor. The inductor is formed by etching a conductive layer, and is preferably formed on any one of conductive patterns including the electrodes of the capacitor. Since an inductance density is high when the line width of the conductive pattern is small, the conductive layer is preferably thinner than another conductive layer and the thickness of the conductive layer is preferably ranges from 1 to 12 μm.

The multilayer wiring board according to the present invention may have a non-through hole which simultaneously penetrates at least one insulating layer containing a high-dielectric material and an insulating layer adjacent to the insulating layer containing the high-dielectric material.

The multilayer wiring board according to the present invention further includes a conductive pattern having a line width of 300 μm or more on an outermost conductive layer, and the thickness of an insulating layer adjacent to the outermost conductive layer is preferably 150 μm or more. The line width is set at 300 μm or more to make it possible to suppress signal attenuation in a high-frequency circuit, and the thickness of the insulating layer is set at 150 μm or more to make it possible to suppress a characteristic impedance from decreasing.

The thickness of a high-dielectric material layer in the multilayer wiring board according to the first aspect of the present invention ranges from 0.1 to 30 μm. The thickness falling in this range is also effective for the multilayer wiring board according to the second and third aspects of the present invention.

The multilayer wiring board according to the first aspect of the present invention can have an asymmetrical laminate structure having a capacitor formed in an arbitrary layer except for a core layer. However, in this case, warpage of the multilayer wiring board preferably has a curvature of $4.0 \times 10^{-4}$ mm$^{-1}$ or less, more preferably, $2.4 \times 10^{-4}$ mm$^{-1}$ or less, especially preferably, $1.4 \times 10^{-4}$ mm$^{-1}$ or less.

Figure 3:
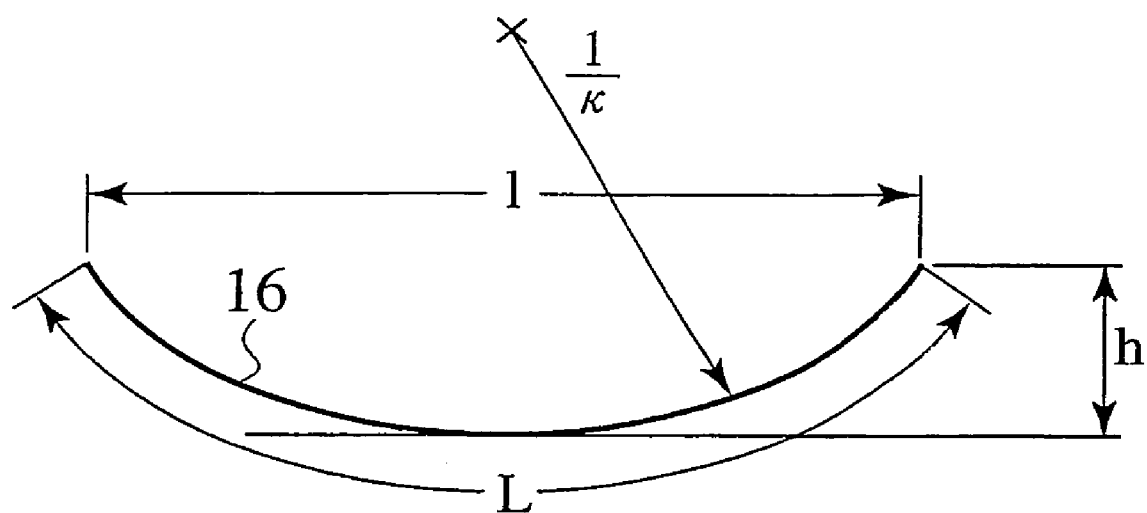
FIG. 3 is a diagram of a wiring board showing reference symbols L, l, and h required to calculate a curvature κ.

In this case, the curvature κ is the inverse number of a radius obtained when a wiring board 16 as shown in FIG. 3 is regarded as a part of an arc. The curvature κ is a value calculated by the following relational expression ("Material System" Vol. 20 (2002), p. 131 to p. 136 edited by Material System and Research Laboratory, Kanazawa Institute of Technology) on the basis of a maximum length L and a warpage h of the wiring board:

$$\kappa = \frac{8h}{L^2(\approx 1^2) + 4h^2}$$

It is assumed that the wiring board is warped at a constant curvature and has equal curvatures at both the sides. The maximum length L of the wiring board represents the length of a diagonal line of the wiring board (if the wiring board is square). In the expression 1, a direct distance 1 is used as an approximate value of the maximum length L. Furthermore, the warpage h represents a distance between a table surface and the bottom surface of an end of the multilayer wiring board when the multilayer wiring board is placed on the table surface to have a recessed surface facing upward, and the warpage h is preferably 1 mm or less, more preferably 0.6 mm or less, especially preferably 0.35 mm or less.

The recessed portion between the conductive patterns of the multilayer wiring board according to the second aspect of the present invention is filled with an insulating resin to planarize a substrate surface on which a high-dielectric material layer is to be formed in advance. The planarization is also effective for the multilayer wiring boards according to the first and third aspect of the present invention.

A conductive pattern including at least one electrode is preferably in contact with different insulating materials of three types including a high-dielectric material. More specifically, as an insulating material filled between the conductive patterns, a third insulating material different from the insulating resins used in the insulating layer serving as a substrate and the high-dielectric material to make it possible to obtain a more excellent capacitor. Furthermore, a capacitor is preferably arranged in an arbitrary layer except for a core layer, and a fluctuation in capacitance of the capacitor is preferably set within the range of less than ±5%.

A manufacturing method of a multilayer wiring board according to the second aspect of the present invention includes at least the step of forming conductive patterns including one of electrodes of a capacitor, the step of filling and hardening an insulating material different from a high-dielectric material in a recessed portion between the conductive patterns, the step of planarizing surfaces of the conductive patterns and a surface of the insulating material filed and hardened between the conductive patterns by polishing, and the step of heating and laminating a metal foil having a high-dielectric material in a semi-hardened state.

The method includes the step of etching the metal foil to form a conductive pattern including the other of the electrodes of the capacitor, and can further include the step of forming an inductor in at least one of the conductor layers.

Furthermore, in the multilayer wiring board according to the third aspect of the present invention, as described above, the thickness of at least one of the opposing capacitor electrodes is set within the range of 1 to 18 μm. However, a counter electrode area where both the opposing electrodes overlap decreases due to a shift which can occur in pattern exposure of a photosensitive resist to decrease the capacitance of the capacitor. In order to suppress the decease in capacitance, an electrode having a thickness ranging from 1 to 18 μm is preferably arranged inside the outer periphery of the electrode opposing the electrode having the thickness. More specifically, one of the electrode is made larger than the range in which one electrode can be shifted in the process to make it possible to exclude a fluctuation in capacitance caused by the shift of the electrode.

Figure 11:
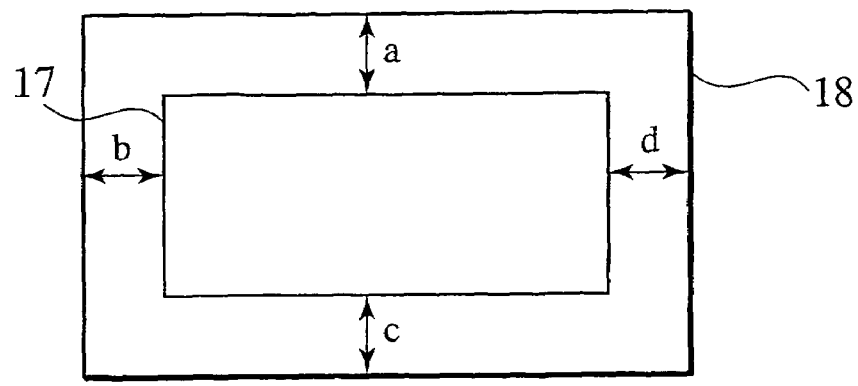
FIG. 11 is a diagram showing minimum horizontal distances between each side surfaces of a capacitor electrode having a thickness ranging from 1 to 18 μm and each side surfaces of a capacitor electrode opposing it.
Figure 13:
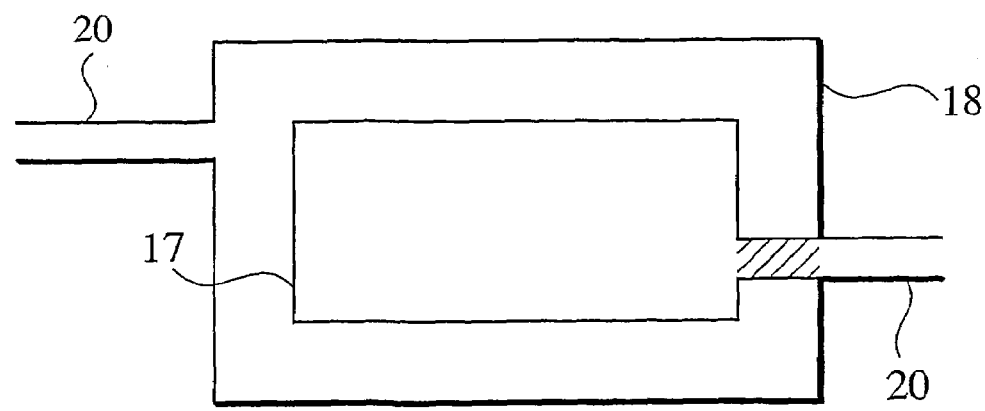
FIG. 13 is a diagram showing a portion (hatched portion) which is not considered as the minimum horizontal distances in FIG. 11.

A minimum horizontal distances between each side surface of a capacitor electrode having a thickness ranging from 1 to 18 μm and each side surface of the electrode opposing the capacitor electrode having above-mentioned thickness preferably ranges from 50 to 100 μm, respectively. When the horizontal distance is shorter than 50 μm, the probability of decreasing a counter electrode area caused by a shift of the electrode increases. When the horizontal distance is longer than 100 μm, the capacitor electrodes increase in size to uneconomically increase the size of the substrate. In FIG. 11, the minimum horizontal distance between each side surfaces of a capacitor electrode 17 having a thickness ranging from 1 to 18 μm and each side surfaces of a capacitor electrode 18 opposing the capacitor electrode 17 is shown as a to d. However, like a hatched portion of a wiring 20 in FIG. 13, a wiring portion extending from one capacitor electrode and overlapping the counter capacitor electrode is neglected.

Figure 12:
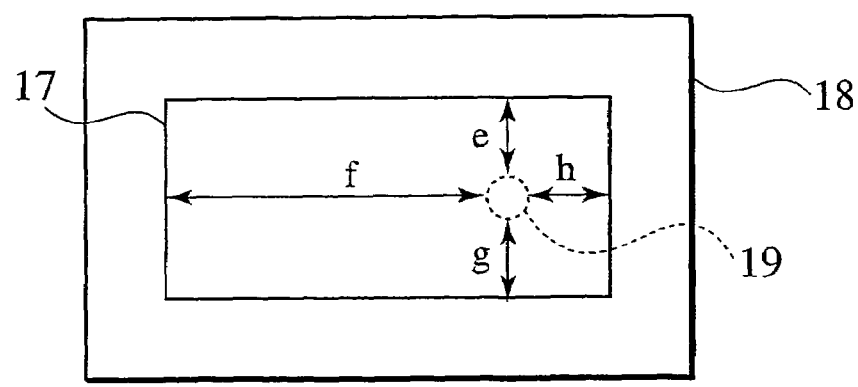
FIG. 12 is a diagram showing minimum horizontal distances between each side surfaces of a capacitor electrode having a thickness ranging from 1 to 18 μm and an outer edge of a hole formed on the electrode.

A minimum horizontal distances between each side surfaces of a capacitor electrode having a thickness ranging from 1 to 18 μm and an outer edge of a conductive hole formed on its capacitor electrode for electrically connecting arbitrary conductive layers are preferably 100 μm or more, respectively. When the horizontal distance is shorter than 100 μm, the probability of a defective connection which may be occurred by shift of the electrode having the thickness ranging from 1 to 18 μm and the hole for electrically connecting arbitrary conductive layers increases. In FIG. 12, A minimum horizontal distance between each side surfaces of the capacitor electrode 17 having a thickness ranging from 1 to 18 μm and the outer edge of a conductive hole 19, formed on the electrode, for electrically connecting arbitrary conductive layers is shown as e to h.

The electrode having a thickness ranging from 1 to 18 μm is preferably formed by etching and removing an unnecessary portion of a conductive layer. As a matter of course, a capacitor according to the present invention can also formed by an additive method or a semi-additive method. However, the capacitor electrode is economically formed by a subtract method using etching, and control of a shift, a fluctuation in size and the like can also be expected according to the method.

As a manufacturing method of a multilayer wiring board according to the present invention, a method wherein, in formation of a conductive pattern, exposure is performed in the same substrate a plurality of times such that a pattern exposure area of a photosensitive resist is set at 1 to 250 $cm^2$/time.

In particular, when a conductive pattern including the capacitor electrode having a thickness ranging from 1 to 18 μm is formed, it is preferable to perform the above-mentioned exposure of the plurality of times. When an exposure area per time is set at smaller than 1 $cm^2$, the number of times of exposure increases, and a manufacturing tact becomes long to increase the cost. On the other hand, when the exposure area per time exceeds 250 $cm^2$, a shift of a pattern cannot be easily reduced. The exposure area per time is more preferably set within the range of 10 to 200 $cm^2$, thereby easily achieve the compatibility between a reduction in shift and suppression of the manufacturing tact. Furthermore, the exposure area per time is especially preferable set within the range of 50 to 150 $cm^2$. In this case, an optimum effect for the reduction in shift and the suppression of the manufacturing tact can be achieved. In this manner, when a divisional exposure scheme in which an exposure area per time is reduced to perform exposure a plurality of time is used, in a large-scale substrate used in manufacturing a usual multilayer wiring board, a shift of a conductive pattern caused in exposure can be reduced with reference to a shift of a pattern caused by expansion and contraction of the substrate.

In the manufacturing method, in pattern exposure of a photosensitive resist, a photomask containing an inorganic material such as soda glass as a main component material is preferably used. In this manner, pattern accuracy after exposure and development of the photosensitive resist increases, and the accuracy of the conductive pattern including a capacitor electrode can be improved.

The method can further include the step of etching and removing an unnecessary portion of a conductive layer to form a conductive pattern including a capacitor electrode.

The present invention further provides a semiconductor device in which a semiconductor chip is mounted on the multilayer wiring board described above. When a multilayer wiring board having capacitors with a slight fluctuation in capacitance, or capacitors with a slight fluctuation in capacitance and inductors having a high inductance density in a substrate is used to make it possible to obtain a semiconductor substrate which can simultaneously achieve a small size and a light weight. A multilayer wiring board in which a conductive pattern having a line width of 300 μm or more is arranged on an outermost conductive layer and the thickness of an insulating layer adjacent to the outermost conductive layer is 150 μm or more is used to make it possible to obtain a semiconductor device having a small high-frequency attenuation and low reflected noise caused by characteristic impedance ununiformity.

The present invention further provides a wireless electronic device in which the semiconductor device is mounted. A small-size, light-weight semiconductor device is used to achieve reductions in size and weight of a wireless electronic device. A wireless electronic device having excellent high-frequency characteristics can also be obtained.

A multilayer wiring board according to the present invention and a manufacturing method of the same will be described below in detail with reference to examples. However, the present invention is not limited to the examples.

Toto Kasei Co., Ltd. was used) as an epoxy resin; 63 parts by weight of a phenol novolac resin (PLYOPHEN LF2882 available from Dainippon Ink And Chemicals, Incorporated was used) as a hardening agent for an epoxy resin; 24 parts by weight of a polyamide-imide resin (weight-average molecular weight: 70000) shown by the following general formula as a high-molecular-weight resin;

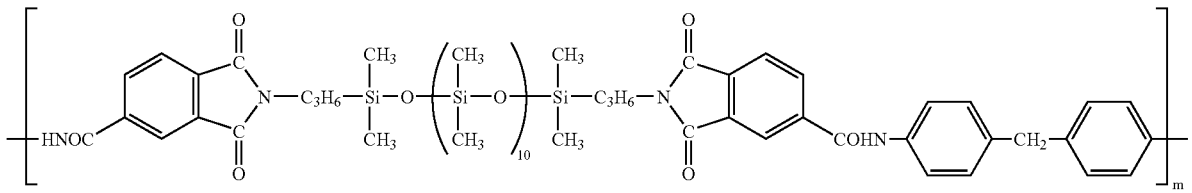

High-Dielectric Material Sheet 1

Methyl ethyl ketone was added to a composition of matter consisting of; 66 parts by weight of a bisphenol-A-type epoxy resin (YD-8125 available from Toto Kasei Co., Ltd. was used) as an epoxy resin, 34 parts by weight of a cresol-novolac-type epoxy resin (YDCN-703 available from Toto Kasei Co., Ltd. was used) as an epoxy resin; 63 parts by weight of a phenol novolac resin (PLYOPHEN LF2882 available from Dainippon Ink And Chemicals, Incorporated was used) as a hardening agent for an epoxy resin; 24 parts by weight of a phenoxy resin (weight-average molecular weight: 50000) (PHENOTOHTO YP-50 available from Toto Kasei Co., Ltd. was used) as a high-molecular-weight resin; 0.6 parts by weight of a hardening accelerator 1-cyanoethyl-2-phenylimidazole (curezole 2PZ-CN was used) as a hardening accelerator; 860 parts by weight of a barium titanate filler (BT-100PR available from Fuji Titanium Industry Co., Ltd. was used) having an average grain diameter of 1.5 µm as a high-dielectric filler; and 5.4 parts by weight of a non-silicone-based dispersing agent (BYK-W9010 available from BYK Chemie Japan KK was used) as a dispersing agent. The resultant mixture was stirred and mixed at 1000 round/min for one hour by using a bead mill, filtered by 200-mesh nylon cloth, and then degassed in a vacuum state. The resin varnish was coated on an electrolytic copper foil (GTS-12 available from FURUKAWA CIRCUIT FOIL Co., Ltd. was used) having a thickness of 12 µm, and was heated and dried at 140° C. for 5 minutes to form a coating film having a thickness of 5 µm and set in a B-stage state. In this manner, a high-dielectric material sheet 1 including a copper foil was manufactured.

When a melting viscosity of the high-dielectric material sheet 1 in the B-stage state at 120° C. was measured by means of a Shimadzu flow tester Model CFT-100 (trade name available from Shimadzu Corporation) using a jig having a nozzle diameter of 2 mmφ, the melting viscosity was 100 Pa·S. With respect to a hardened material hardened at 170° C. for one hour, when a dielectric constant was calculated by using an LCR meter YHP4275A (trade name available from Yokogawa Hewlett-Packard Co.,) on the basis of an impedance characteristic at 25° C. and 1 MHz, the dielectric constant was 20.

High-Dielectric Material Sheet 2

Methyl ethyl ketone was added to a composition of matter consisting of; 66 parts by weight of a bisphenol-A-type epoxy resin (YD-8125 available from Toto Kasei Co., Ltd. was used) as an epoxy resin, 34 parts by weight of a cresol-novolac-type epoxy resin (YDCN-703 available from Toto Kasei Co., Ltd. was used) as an epoxy resin; 63 parts by weight of a phenol novolac resin (PLYOPHEN LF2882 available from Dainippon Ink And Chemicals, Incorporated was used) as a hardening agent for an epoxy resin; 24 parts by weight of a polyamide-imide resin (weight-average molecular weight: 70000) shown by the following general formula as a high-molecular-weight resin;

0.6 parts by weight of a hardening accelerator 1-cyanoethyl-2-phenylimidazole (curezole 2PZ-CN was used) as a hardening accelerator; 1300 parts by weight of a barium titanate filler (BT-100PR available from Fuji Titanium Industry Co., Ltd. was used) having an average grain diameter of 1.5 µm as a high-dielectric filler; 400 parts by weight of a barium titanate filler (HPBT-1 available from Fuji Titanium Industry Co., Ltd. was used) having an average grain diameter of 0.6 µm as a high-dielectric filler; and 11.2 parts by weight of a non-silicone-based dispersing agent (BYK-W9010 available from BYK Chemie Japan KK was used) as a dispersing agent. The resultant mixture was stirred and defoamed for one hour by using a small-size stirring defoamer and filtered by 200-mesh nylon cloth. The resin varnish was coated on an electrolytic copper foil (GTS-12 available from FURUKAWA CIRCUIT FOIL Co., Ltd. was used) having a thickness of 12 µm, and was heated and dried at 140° C. for 5 minutes to form a coating film having a thickness of 10 µm and set in a B-stage state. In this manner, a high-dielectric material sheet 2 including a copper foil was manufactured.

When a melting viscosity of the high-dielectric material sheet 2 in the B-stage state at 120° C. was measured by means of a Shimadzu flow tester Model CFT-100 (trade name available from Shimadzu Corporation) using a jig having a nozzle diameter of 2 mmφ, the melting viscosity was 200 Pa·S. With respect to a hardened material hardened at 170° C. for one hour, when a dielectric constant was calculated by using an LCR meter YHP4275A (trade name available from Yokogawa Hewlett-Packard Co.,) on the basis of an impedance characteristic at 25° C. and 1 MHz, the dielectric constant was 45.

High-Dielectric Material Sheet 3

Methyl ethyl ketone was added to a composition of matter consisting of; 66 parts by weight of a bisphenol-A-type epoxy resin (YD-8125 available from Toto Kasei Co., Ltd. was used) as an epoxy resin, 34 parts by weight of a cresol-novolac-type epoxy resin (YDCN-703 available from Toto Kasei Co., Ltd. was used) as an epoxy resin; 63 parts by weight of a phenol novolac resin (PLYOPHEN LF2882 available from Dainippon Ink And Chemicals, Incorporated was used) as a hardening agent for an epoxy resin; 24 parts by weight of a phenoxy resin (weight-average molecular weight: 50000) (PHENOTOHTO YP-50 available from Toto Kasei Co., Ltd. was used) as a high-molecular-weight resin; 0.6 parts by weight of a hardening accelerator 1-cyanoethyl- 2-phenylimidazole (curezole 2PZ-CN was used) as a hardening accelerator; 1300 parts by weight of a barium titanate filler (BT-100PR available from Fuji Titanium Industry Co., Ltd. was used) having an average grain diameter of 1.5 μm as a high-dielectric filler; 400 parts by weight of a barium titanate filler (HPBT-1 available from Fuji Titanium Industry Co., Ltd. was used) having an average grain diameter of 0.6 μm as a high-dielectric filler; and 11.2 parts by weight of a non-silicone-based dispersing agent (BYK-W9010 available from BYK Chemie Japan KK was used) as a dispersing agent. The resultant mixture was stirred and mixed at 1000 round/min for one hour by using a bead mill, filtered by 200-mesh nylon cloth, and then degassed in a vacuum state. The resin varnish was coated on an electrolytic copper foil (GTS-12 available from FURUKAWA CIRCUIT FOIL Co., Ltd. was used) having a-thickness of 12 μm, and was heated and dried at 140° C. for 5 minutes to form a coating film having a thickness of 10 μm and set in a B-stage state. In this manner, a high-dielectric material sheet 3 including a copper foil was manufactured.

When a melting viscosity of the high-dielectric material sheet 3 in the B-stage state at 120° C. was measured by means of a Shimadzu flow tester Model CFT-100 (trade name available from Shimadzu Corporation) using a jig having a nozzle diameter of 2 mmφ, the melting viscosity was 150 Pa·S. With respect to a hardened material hardened at 170° C. for one hour, when a dielectric constant was calculated by using an LCR meter YHP4275A (trade name available from Yokogawa Hewlett-Packard Co.,) on the basis of an impedance characteristic at 25° C. and 1 MHz, the dielectric constant was 45.

High-Dielectric Material Sheet 4

Methyl ethyl ketone was added to a composition of matter consisting of; 66 parts by weight of a bisphenol-A-type epoxy resin (YD-8125 available from Toto Kasei Co., Ltd. was used) as an epoxy resin, 34 parts by weight of a cresol-novolac-type epoxy resin (YDCN-703 available from Toto Kasei Co., Ltd. was used) as an epoxy resin; 63 parts by weight of a phenol novolac resin (PLYOPHEN LF2882 available from Dainippon Ink And Chemicals, Incorporated was used) as a hardening agent for an epoxy resin; 24 parts by weight of a phenoxy resin (weight-average molecular weight: 50000) (PHENOTOHTO YP-50 available from Toto Kasei Co., Ltd. was used) as a high-molecular-weight resin; 0.6 parts by weight of a hardening accelerator 1-cyanoethyl-2-phenylimidazole (curezole 2PZ-CN was used) as a hardening accelerator; 1900 parts by weight of a barium titanate filler (BT-100PR available from Fuji Titanium Industry Co., Ltd. was used) having an average grain diameter of 1.5 μm as a high-dielectric filler; 550 parts by weight of a barium titanate filler (HPBT-1 available from Fuji Titanium Industry Co., Ltd. was used) having an average grain diameter of 0.6 μm as a high-dielectric filler; and 15.9 parts by weight of a non-silicone-based dispersing agent (BYK-W9010 available from BYK Chemie Japan KK was used) as a dispersing agent. The resultant mixture was stirred and mixed at 1000 round/min for one hour by using a bead mill, filtered by 200-mesh nylon cloth, and then degassed in a vacuum state. The resin varnish was coated on an electrolytic copper foil (GTS-12 available from FURUKAWA CIRCUIT FOIL Co., Ltd. was used) having a thickness of 12 μm, and was heated and dried at 140° C. for 5 minutes to form a coating film having a thickness of 25 μm and set in a B-stage state. In this manner, a high-dielectric material sheet 4 including a copper foil was manufactured.

When a melting viscosity of the high-dielectric material sheet 4 in the B-stage state at 120° C. was measured by means of a Shimadzu flow tester Model CFT-100 (trade name available from Shimadzu Corporation) using a jig having a nozzle diameter of 2 mmφ, the melting viscosity was 200 Pa·S. With respect to a hardened material hardened at 170° C. for one hour, when a dielectric constant was calculated by using an LCR meter YHP4275A (trade name available from Yokogawa Hewlett-Packard Co.,) on the basis of an impedance characteristic at 25° C. and 1 MHz, the dielectric constant was 70.

High-Dielectric Material Sheet 5

Methyl ethyl ketone was added to a composition of matter consisting of; 66 parts by weight of a bisphenol-A-type epoxy resin (YD-8125 available from Toto Kasei Co., Ltd. was used) as an epoxy resin, 34 parts by weight of a cresol-novolac-type epoxy resin (YDCN-703 available from Toto Kasei Co., Ltd. was used) as an epoxy resin; 63 parts by weight of a phenol novolac resin (PLYOPHEN LF2882 available from Dainippon Ink And Chemicals, Incorporated was used) as a hardening agent for an epoxy resin; 24 parts by weight of a phenoxy resin (weight-average molecular weight: 50000) (PHENOTOHTO YP-50 available from Toto Kasei Co., Ltd. was used) as a high-molecular-weight resin; 0.6 parts by weight of a hardening accelerator 1-cyanoethyl-2-phenylimidazole (curezole 2PZ-CN was used) as a hardening accelerator; 860 parts by weight of a barium titanate filler (BT-100PR available from Fuji Titanium Industry Co., Ltd. was used) having an average grain diameter of 1.5 μm as a high-dielectric filler; and 5.4 parts by weight of a non-silicone-based dispersing agent (BYK-W9010 available from BYK Chemie Japan KK was used) as a dispersing agent. The resultant mixture was stirred and mixed at 1000 round/min for one hour by using a bead mill, filtered by 200-mesh nylon cloth, and then degassed in a vacuum state. The resin varnish was coated on an electrolytic copper foil (GTS-12 available from FURUKAWA CIRCUIT FOIL Co., Ltd. was used) having a thickness of 12 μm, and was heated and dried at 140° C. for 5 minutes to form a coating film having a thickness of 30 μm and set in a B-stage state. In this manner, a high-dielectric material sheet 5 including a copper foil was manufactured.

When a melting viscosity of the high-dielectric material sheet 5 in the B-stage state at 120° C. was measured by means of a Shimadzu flow tester Model CFT-100 (trade name available from Shimadzu Corporation) using a jig having a nozzle diameter of 2 mmφ, the melting viscosity was 100 Pa·S. With respect to a hardened material hardened at 170° C. for one hour, when a dielectric constant was calculated by using an LCR meter YHP4275A (trade name available from Yokogawa Hewlett-Packard Co.,) on the basis of an impedance characteristic at 25° C. and 1 MHz, the dielectric constant was 20.

EXAMPLE 1

Figure 2:
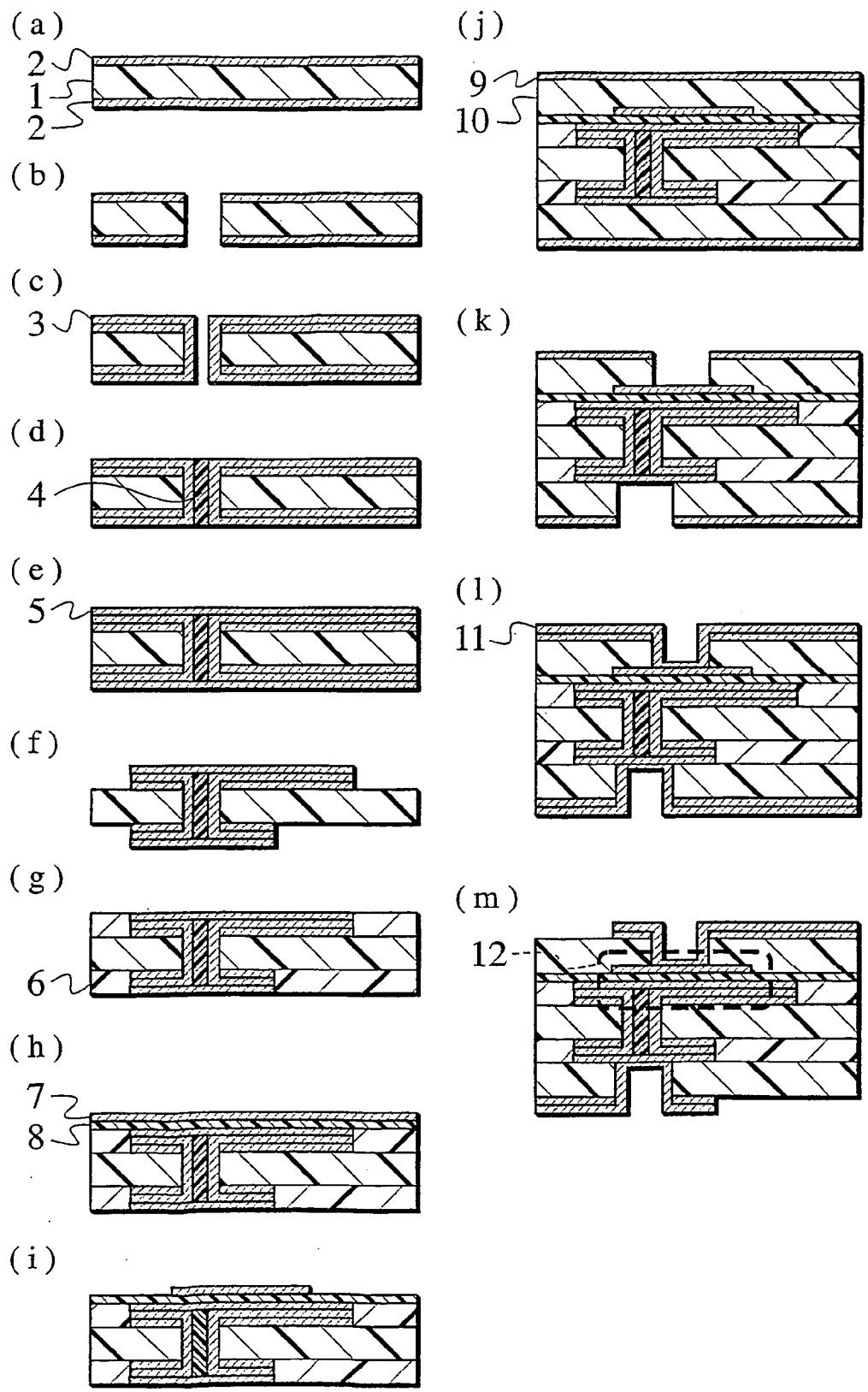
FIG. 2 is a sectional view showing an example of a manufacturing method of a multilayer wiring board according to the present invention.

Desired drilling was performed to a double-side copper-plated glass epoxy laminated layer substrate MCL-E679F (trade name available from Hitachi Chemical Co., Ltd.) having a substrate thickness of 0.2 mm and a substrate size of 500×333 cm and obtained by laminating copper foils 2 each having a thickness of 3 μm on both the surfaces of a substrate 1 as shown in FIG. 2(*a*) (FIG. 2(*b*)). Carbonized resin residues were removed with an alkali permanganic acid solution by means of ultrasonic cleaning, and catalytic addition was performed to the substrate to accelerate adhesion. Thereafter, electroless copper plating was performed to form an electroless copper-plated layer 3 having a thickness of about 15 μm on the inner wall of the drill hole and the surface of the copper foil (FIG. 2(c)). Black oxide finish using sodium hypochlorite as a main component and reduction using dimethylamino borane as a main component were performed to the surface of the substrate to perform coarsening. A paste-type thermoset insulating material HRP-700BA (trade name available from Taiyo Ink Mfg Co., Ltd.) 4 was filled in the drill hole of the substrate by a screen printing and hardened by heat treatment at 170° C. for 60 minutes (FIG. 2(d)). The substrate surface was polished by a buff brush to remove an excessive insulating material. Thereafter, catalytic addition was performed to the substrate to accelerate adhesion. Electroless copper plating was performed to the substrate to form an electroless copper-plated layer 5 having a thickness of about 15 μm on the substrate surface (FIG. 2(e)). After the substrate was polished by a buff brush, a photosensitive dry film H-9040 (trade name available from Hitachi Chemical Co., Ltd.) was laminated on the substrate. On the substrate surface, an etching resist for a conductive pattern including a capacitor electrode was exposed by an automatic parallel exposure system (EXM-1350B available from ORC MANUFACTURING Co., Ltd.). The substrate was developed by a sodium carbonate aqueous solution, and unnecessary copper was etched by ferric chloride solution. The resist was peeled by a sodium hydroxide aqueous solution to manufacture an inner-layer circuit substrate having a circuit pattern including a lower electrode of a capacitor (FIG. 2(f))

A paste-type thermoset insulating material HRP-700BA (trade name available from Taiyo Ink Mfg Co., Ltd.) 6 was coated by using a roll coater on the surface of the inner-layer circuit substrate to have a thickness of about 40 μm from the surface of the substrate insulating layer and a thickness of about 5 μm from the surface of the conductive pattern, and was hardened by heat treatment at 170° C. for 60 minutes. The substrate was polished by a buff brush until the surface of the conductive pattern surface was exposed to remove an excessive insulating material, thereby planarizing the inner layer circuit substrate (FIG. 2(g)). An unevenness of the surface of the inner layer circuit substrate was 3 μm or less. Thereafter, black oxide finish using sodium hypochlorite as a main component and reduction using dimethylamino borane as a main component were performed to the circuit surface of the circuit substrate to perform coarsening.

A high-dielectric material sheet 1 having an insulating layer 8 containing a high-dielectric material and a copper foil 7 was laminated and integrated on one surface of the circuit substrate under press conditions: a temperature of 170° C.; a pressure of 1.5 MPa; and heating-pressuring time of 60 minutes (FIG. 2(h)). After the laminated structure was polished by a buff brush, a photosensitive dry film H-9040 (trade name available from Hitachi Chemical Co., Ltd.) was laminated on the copper foil of the high-dielectric material sheet 1. On the substrate surface, an etching resist for a conductive pattern including a capacitor electrode was exposed by an automatic parallel exposure system (EXM-1350B available from ORC MANUFACTURING Co., Ltd.). The substrate was developed by a sodium carbonate aqueous solution, and unnecessary copper was etched by ferric chloride solution. The resist was peeled by a sodium hydroxide aqueous solution to manufacture a conductive pattern including an upper electrode of the capacitor (FIG. 2(i)).

Black oxide finish using sodium hypochlorite as a main component and reduction using dimethylamino borane as a main component were performed to the circuit surface of the circuit substrate to perform coarsening. (1) a copper foil MT35S3 (trade name available from Mitsui Mining And Smelting Company, Limited) 9, (2) two sheets of filler-contained glass epoxy prepreg GEA-679F (trade name available from Hitachi Chemical Co., Ltd.) 10 each having a thickness of 80 μm, (3) the circuit substrate in FIG. 2(i), (4) two sheets of filler-contained glass epoxy prepreg GEA-679F each having a thickness of 80 μm, (5) a copper foil MT35S3 (trade name available from Mitsui Mining And Smelting Company, Limited) whose thickness is 3 μm and having a 35 μm carrier copper foil were laminated in the order named, and laminated and integrated under press conditions: a temperature of 170° C.; a pressure of 1.5 MPa; and heating-pressuring time of 60 minutes (FIG. 2(j)). The carrier copper foil was peeled, and an unnecessary substrate end was cut out. Thereafter, a desired etching resist was formed on the surface of the substrate, and an unnecessary copper foil was etched by using a ferric chloride aqueous solution to form a window hole having a diameter of φ0.15 mm at a desired position.

At the position corresponding to the window hole formed in the substrate surface, laser boring was performed by using a Model ML505GT carbon dioxide laser available from Mitsubishi Electric Corporation under conditions: output power of 26 mJ, pulse width of 10 μs, and six shots (FIG. 2(k)). After carbonized resin residues were removed with an alkali permanganic acid solution by means of ultrasonic cleaning, cleaning and catalytic addition were performed to the substrate to accelerate adhesion. Thereafter, electroless copper plating was performed by using CUST-3000 (trade name available from Hitachi Chemical Co., Ltd.) to form an electroless copper-plated layer 11 having a thickness of about 20 μm on the inner wall of the laser hole and the surface of the copper foil (FIG. 2(l)). An etching resist was formed at necessary portions such as pads on the substrate surface, the circuit pattern, and the like, and unnecessary copper was etched by using a ferric chloride aqueous solution to form an outer layer circuit (FIG. 2(m)).

A solder resist PSR-4000AUS5 (trade name available from Taiyo Ink Mfg Co., Ltd.) was coated by using a roll coater on the substrate surface to have a thickness of 30 μm and dried, and then exposed and developed to form a solder resist 15 at a desired position. Thereafter, on the surface layer of the exposed part of an outer layer circuit pattern, an electroless nickel-plated layer 13 with a thickness of 3 μm is formed using NIPS100 (trade name available from Hitachi Chemical Co., Ltd.) and an electroless gold-plated layer 14 with a thickness of 0.1 μm is formed using HGS2000 (trade name Hitachi Chemical Co., Ltd.) to obtain a five-layer multilayer wiring board in which a capacitor 12 as shown in FIG. 1 was built.

EXAMPLE 2

A multilayer wiring board was obtained by the same steps as those in Example 1 except that the high-dielectric material sheet 2 was used in place of the high-dielectric material sheet 1.

EXAMPLE 3

A multilayer wiring board was obtained by the same steps as those in Example 1 except that the high-dielectric material sheet 3 was used in place of the high-dielectric material sheet 1.

EXAMPLE 4

A multilayer wiring board was obtained by the same steps as those in Example 1 except that the high-dielectric material sheet 4 was used in place of the high-dielectric material sheet 1.

EXAMPLE 5

A multilayer wiring board was obtained by the same steps as those in Example 1 except that an inner layer circuit substrate was not planarized by resin filling as shown in FIG. 2(g) and that the high-dielectric material sheet 5 was used in place of the high-dielectric material sheet 1.

COMPARATIVE EXAMPLE 1

A multilayer wiring board was obtained by the same steps as those in Example 5 except that a copper foil MCF6000E (trade name available from Hitachi Chemical Co., Ltd.) with an epoxy-based resin whose thickness of dielectric-material layer is 80 μm was used as a high-dielectric material sheet.

Each of the multilayer wiring boards obtained by Examples 1 to 5 and Comparative Example 1 was cut into pieces to obtain test samples each having a size of 100 mm×100 mm, and warpages of the samples were measured. Furthermore, curvatures were calculated by using the expression 1. The obtained results were shown in Table 1.

TABLE 1

| Item | Thickness of High-dielectric Material Layer (μm) | Warpage (mm) | Curvature (mm$^{-1}$) |
|---|---|---|---|
| Example 1 | 5 | 0.3 | $1.20 \times 10^{-4}$ |
| Example 2 | 10 | 0.4 | $1.60 \times 10^{-4}$ |
| Example 3 | 10 | 0.4 | $1.60 \times 10^{-4}$ |
| Example 4 | 25 | 0.5 | $2.00 \times 10^{-4}$ |
| Example 5 | 30 | 0.7 | $2.80 \times 10^{-4}$ |
| Comparative Example 1 | 80 | 1.2 | $4.80 \times 10^{-4}$ |

Each of the multilayer wiring boards according to Example 1 to 5 is a capacitor-built-in multilayer wiring board in which a specific inductive capacity of a high-dielectric hardened material ranges 20 to 100 at 25° C., 1 MHz and which has a thickness of 0.1 to 30 μm. All the multilayer wiring boards according to Example 1 to 5 have a curvature of $4.0 \times 10^{-4}$ mm$^{-1}$ or less and a small warpage of 1 mm or less. On the other hand, in Comparative Example 1, since the thickness of the high-dielectric material is 80 μm, the curvature of the high-dielectric material exceeds $4.0 \times 10^{-4}$ mm$^{-1}$, and a warpage also exceeds 1 mm.

EXAMPLE 6

With respect to the multilayer wiring board obtained in Example 1, a fluctuation in capacitance of a capacitor and moldability were evaluated. A method of measuring a capacitance of capacitor and a method of evaluating moldability are as follows.

(Capacitance of Capacitor)

In measurement of a capacitance of a capacitor, a measurement system obtained by connecting a high-frequency signal measurement probe MICROPROBE ACP50 (Model GSG250, trade name available from Cascade Corporation) to an impedance analyzer 4291B (trade name available from Agilent Technologies) through a 50, coaxial cable SUCOFLEX104/100 (trade name available SUHNER INC.) was used. The electrode size of the capacitor was set at 1 mm×1 mm to measure a capacitance at 1 GHz. Capacitances of capacitors arranged at five portions, i.e., the four corners and the center of the substrate were measured.

(Moldability)

The moldability was evaluated whether voids and the like are in the multilayer wiring board after cutting the manufactured multilayer wiring board in a size of 10 mm×30 mm, casting an epoxy resin and polishing the cross-section of the substrate. When no voids or the like were present, it was determined that the moldability was good. When voids or the like were present, it was determined that the moldability was not good.

EXAMPLE 7

With respect to a multilayer wiring board obtained in Example 2, a fluctuation in capacitance of a capacitor and moldability were evaluated as in the same manner as that in Example 6.

EXAMPLE 8

With respect to a multilayer wiring board obtained in Example 3, a fluctuation in capacitance of a capacitor and moldability were evaluated as in the same manner as that in Example 6.

EXAMPLE 9

With respect to a multilayer wiring board obtained in Example 4, a fluctuation in capacitance of a capacitor and moldability were evaluated in the same manner as that in Example 6.

COMPARATIVE EXAMPLE 2

With respect to a multilayer wiring board which was manufactured in the same manner as that in Example 3 except that an inner layer circuit substrate was not planarized by filling a resin as shown in FIG. 2(g), a fluctuation in capacitance of a capacitor and moldability were evaluated in the same manner as that in Example 6.

COMPARATIVE EXAMPLE 3

With respect to the multilayer wiring board obtained in Example 5, a fluctuation in capacitance of a capacitor and moldability were evaluated in the same manner as that in Example 6.

Results obtained in Examples 6 to 9 and Comparative Examples 2 and 3 are shown in Table 2.

TABLE 2

| | | Capacitance of Capacitor (pF) | | | |
|---|---|---|---|---|---|
| Item | | Maximum Value | Minimum Value | Average Value | Moldability |
| Example | 6 | 31 | 32 | 32 | Good |
| | 7 | 37 | 35 | 36 | Good |
| | 8 | 38 | 35 | 36 | Good |
| | 9 | 23 | 22 | 23 | Good |
| Comparative Example | 2 | 39 | 36 | 38 | Not good |
| | 3 | 36 | 30 | 32 | Good |

In each of Examples 6 to 9, a third thermoset insulating material which is different in a substrate material and a high-dielectric material was filled in a recessed portion between capacitor electrodes and was planarized. For this reason, a fluctuation in capacitance of a capacitor was small, i.e., less than ±5%, and the moldability was good. On the other hand, in Comparative Example 2, the moldability was not good because voids were present between the capacitor electrodes. In Comparative Example 3, the fluctuation in capacitance of the capacitor exceeded 10%. On the basis of a result of cross-section observation, it was understood that the large fluctuation was because the thickness of an insulating layer containing a high-dielectric material largely fluctuated within the range of 3 to 6 μm.

Multilayer wiring boards using the following high-dielectric material sheets 6 to 10 were manufactured as the following Examples 10 to 19 and Comparative Example 4. shift of capacitor electrodes, fluctuations in size, and fluctuations in capacitance, on these multilayer wiring boards were evaluated.

High-Dielectric Material Sheet 6

Methyl ethyl ketone was added to a composition of matter consisting of; 66 parts by weight of a bisphenol-A-type epoxy resin (YD-8125 available from Toto Kasei Co., Ltd. was used) as an epoxy resin, 34 parts by weight of a cresol-novolac-type epoxy resin (YDCN-703 available from Toto Kasei Co., Ltd. was used) as an epoxy resin; 63 parts by weight of a phenol novolac resin (PLYOPHEN LF2882 available from Dainippon Ink And Chemicals, Incorporated was used) as a hardening agent for an epoxy resin; 24 parts by weight of a phenoxy resin (weight-average molecular weight: 50000) (PHENOTOHTO YP-50 available from Toto Kasei Co., Ltd. was used) as a high-molecular-weight resin; 0.6 parts by weight of a hardening accelerator 1-cyanoethyl-2-phenylimidazole (curezole 2PZ-CN was used) as a hardening accelerator; 1300 parts by weight of a barium titanate filler (BT-100PR available from Fuji Titanium Industry Co., Ltd. was used) having an average grain diameter of 1.5 μm as a high-dielectric filler; 400 parts by weight of a barium titanate filler (HPBT-1 available from Fuji Titanium Industry Co., Ltd. was used) having an average grain diameter of 0.6 μm as a high-dielectric filler; and 11.2 parts by weight of a non-silicone-based dispersing agent (BYK-W9010 available from BYK Chemie Japan KK was used) as a dispersing agent. The resultant mixture was stirred and mixed at 1000 round/min for one hour by using a bead mill, filtered by 200-mesh nylon cloth, and then degassed in a vacuum state. The resin varnish was coated on an electrolytic copper foil (GTS-12 available from FURUKAWA CIRCUIT FOIL Co., Ltd. was used) having a thickness of 12 μm, and was heated and dried at 140° C. for 5 minutes to form a coating film having a thickness of 10 μm and set in a B-stage state. In this manner, a high-dielectric material sheet 6.

With respect to a hardened material obtained by hardening the B-stage adhesive film at 170° C. for one hour, when a dielectric constant was calculated by using an LCR meter YHP4275A (trade name available from Yokogawa Hewlett-Packard Co.,) on the basis of an impedance characteristic at 25° C. and 1 MHz, the dielectric constant was 45.

High-Dielectric Material Sheet 7

A high-dielectric material sheet 7 was obtained by the same steps as those of the high-dielectric material sheet 6 except that the electrolytic copper foil to be coated with the adhesive varnish was replaced with a copper foil (MT35S3 available from Mitsui Mining And Smelting Company, Limited was used) whose thickness is 3 μm and having a 35 μm carrier copper foil.

With respect to a hardened material obtained by hardening the B-stage adhesive film at 170° C. for one hour, when a dielectric constant was calculated by using an LCR meter YHP4275A (trade name available from Yokogawa Hewlett-Packard Co.,) on the basis of an impedance characteristic at 25° C. and 1 MHz, the dielectric constant was 45.

High-Dielectric Material Sheet 8

A high-dielectric material sheet 8 was obtained by the same steps as those of the high-dielectric material sheet 6 except that the electrolytic copper foil to be coated with the adhesive varnish was replaced with an electrolytic copper foil (GTS-9 available from FURUKAWA CIRCUIT FOIL Co., Ltd. was used) having a thickness of 9 μm.

With respect to a hardened material obtained by hardening the B-stage adhesive film at 170° C. for one hour, when a dielectric constant was calculated by using an LCR meter YHP4275A (trade name available from Yokogawa Hewlett-Packard Co.,) on the basis of an impedance characteristic at 25° C. and 1 MHz, the dielectric constant was 45.

High-Dielectric Material Sheet 9

A high-dielectric material sheet 9 was obtained by the same steps as those of the high-dielectric material sheet 6 except that the electrolytic copper foil to be coated with the adhesive varnish was replaced with an electrolytic copper foil (GTS-18 available from FURUKAWA CIRCUIT FOIL Co., Ltd. was used) having a thickness of 18 μm.

With respect to a hardened material obtained by hardening the B-stage adhesive film at 170° C. for one hour, when a dielectric constant was calculated by using an LCR meter YHP4275A (trade name available from Yokogawa Hewlett-Packard Co.,) on the basis of an impedance characteristic at 25° C. and 1 MHz, the dielectric constant was 45.

High-Dielectric Material Sheet 10

A high-dielectric material sheet 10 was obtained by the same steps as those of the high-dielectric material sheet 6 except that the electrolytic copper foil to be coated with the adhesive varnish was replaced with an electrolytic copper foil (GTS-35 available from FURUKAWA CIRCUIT FOIL Co., Ltd. was used) having a thickness of 35 μm.

With respect to a hardened material obtained by hardening the B-stage adhesive film at 170° C. for one hour, when a dielectric constant was calculated by using an LCR meter YHP4275A (trade name available from Yokogawa Hewlett-Packard Co.,) on the basis of an impedance characteristic at 25° C. and 1 MHz, the dielectric constant was 45.

EXAMPLE 10

Figure 4:
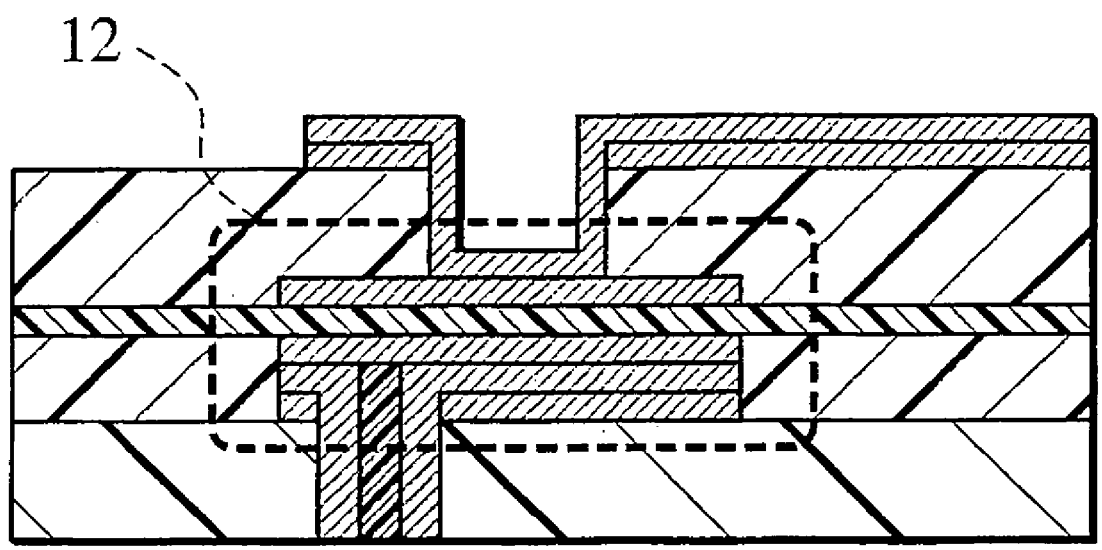
FIG. 4 is a sectional view showing the structure of a capacitor electrode manufactured by Example 10 and Examples 16 to 19.

A multilayer wiring board was obtained in the same manner as that in Example 1 except that the high-dielectric material sheet 6 was used in place of the high-dielectric material sheet 1, that exposure in formation of the upper electrode of the capacitor was performed by using a divisional projection exposure system Model UX-5038SC available from USHIO INC. in place of an automatic parallel exposure system Model EXM-1350B available from ORC MANUFACTURING Co., Ltd. such that the sheet was divided into patterns each having an area of 10 cm square by using a photomask containing soda glass as a base material, and that the upper and lower electrodes of the capacitor were formed to have sizes of 1.0 mm×0.75 mm, respectively. The sectional view of a capacitor 12 in Example 10 is shown in FIG. 4.

EXAMPLE 11

Figure 5:
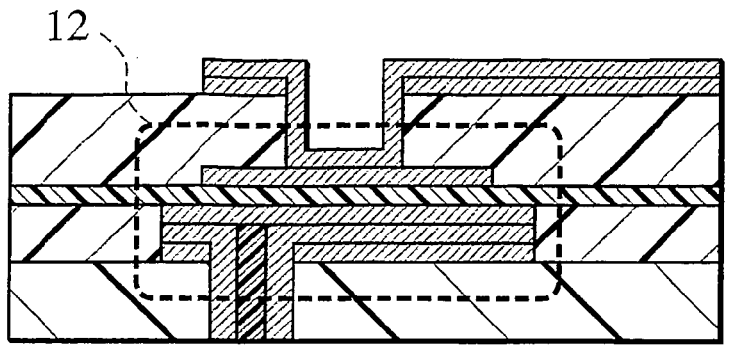
FIG. 5 is a sectional view showing the structure of a capacitor electrode manufactured by Example 11.

A multilayer wiring board was obtained in the same manner as that in Example 10 except that the sizes of the upper and lower electrodes of the capacitors were 1.0 mm×0.75 mm and 1.05×0.755 mm, respectively. The sectional view of a capacitor 12 in Example 11 is shown in FIG. 5.

EXAMPLE 12

Figure 6:
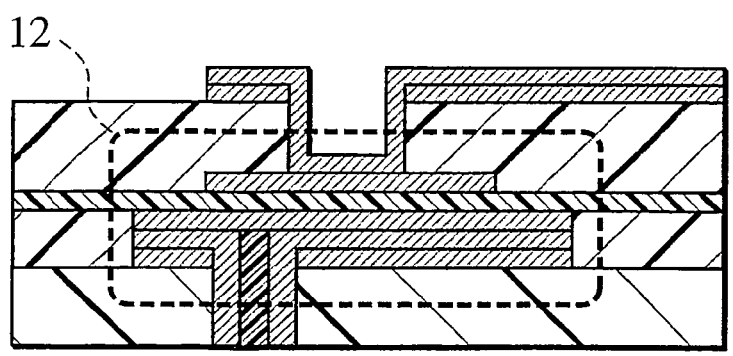
FIG. 6 is a sectional view showing the structure of a capacitor electrode manufactured by Example 12.

A multilayer wiring board was obtained in the same manner as that in Example 10 except that the sizes of the upper and lower electrodes of the capacitors were 1.0 mm×0.75 mm and 1.1×0.85 mm, respectively. The sectional view of a capacitor 12 in Example 12 is shown in FIG. 6.

EXAMPLE 13

Figure 7:
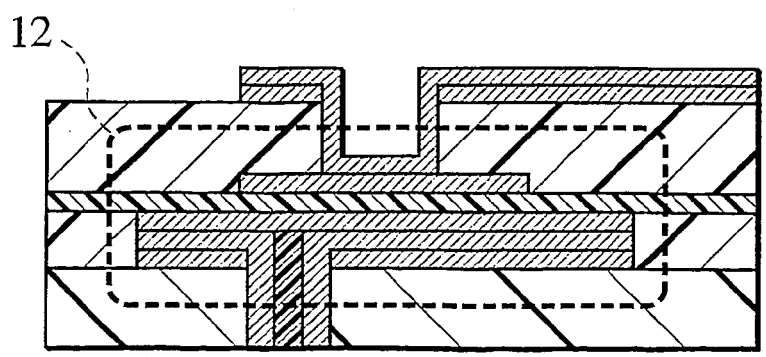
FIG. 7 is a sectional view showing the structure of a capacitor electrode manufactured by Example 13.

A multilayer wiring board was obtained in the same manner as that in Example 10 except that the sizes of the upper and lower electrodes of the capacitors were 1.0 mm×0.75 mm and 1.2×0.95 mm, respectively. The sectional view of a capacitor 12 in Example 13 is shown in FIG. 7.

EXAMPLE 14

Figure 8:
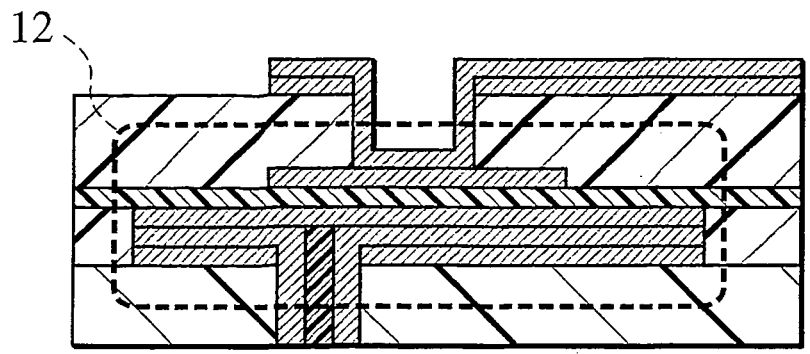
FIG. 8 is a sectional view showing the structure of a capacitor electrode manufactured by Example 14.

A multilayer wiring board was obtained in the same manner as that in Example 10 except that the sizes of the upper and lower electrodes of the capacitors were 1.0 mm×0.75 mm and 1.4×1.15 mm, respectively. The sectional view of a capacitor 12 in Example 14 is shown in FIG. 8.

EXAMPLE 15

Figure 9:
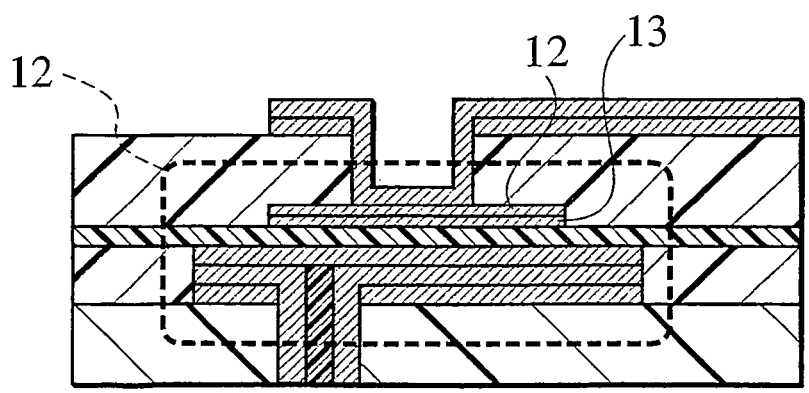
FIG. 9 is a sectional view showing the structure of a capacitor electrode manufactured by Example 15.

A multilayer wiring board was obtained in the same manner as that in Example 10 except that the high-dielectric material sheet 7 was used in place of the high-dielectric material sheet 6, that an upper electrode of a capacitor was formed by forming an electrolytic copper-plated layer having a thickness of about 15 μm on the copper foil of the high-dielectric material sheet 7 and etching an underlying copper by a liquid mixture of sulfuric acid and hydrogen peroxide after a plating resist was peeled, and that the sizes of the upper and lower electrodes of the capacitors were 1.0 mm×0.75 mm and 1.1×0.85 mm, respectively. The sectional view of a capacitor 12 in Example 15 is shown in FIG. 9.

EXAMPLE 16

A multilayer wiring board was obtained in the same manner as that in Example 10 except that exposure was performed such that the sheet was divided into patterns each having an area of 5 cm square in use of a divisional projection exposure system. The sectional view of a capacitor 12 in Example 16 is shown in FIG. 4.

EXAMPLE 17

A multilayer wiring board was obtained in the same manner as that in Example 10 except that exposure was performed such that the sheet was divided into patterns each having an area of 15 cm square in use of a divisional projection exposure system. The sectional view of a capacitor 12 in Example 17 is shown in FIG. 4.

EXAMPLE 18

A multilayer wiring board was obtained in the same manner as that in Example 10 except that the high-dielectric material sheet 8 was used in place of the high-dielectric material sheet 6. The sectional view of a capacitor 12 in Example 18 is shown in FIG. 4.

EXAMPLE 19

A multilayer wiring board was obtained in the same manner as that in Example 10 except that the high-dielectric material sheet 9 was used in place of the high-dielectric material sheet 6. The sectional view of a capacitor 12 in Example 19 is shown in FIG. 4.

COMPARATIVE EXAMPLE 4

Figure 10:
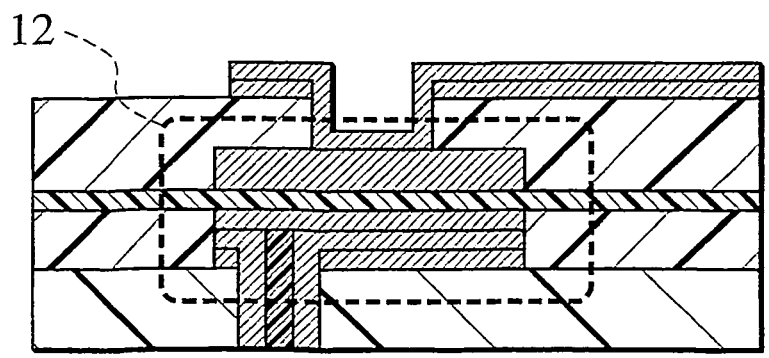
FIG. 10 is a sectional view showing the structure of a capacitor electrode manufactured by Comparative Example 4.

A multilayer wiring board was obtained in the same manner as that in Example 10 except that the high-dielectric material sheet 10 was used in place of the high-dielectric material sheet 6, that exposure in formation of the upper electrode of the capacitor was performed by batch exposure using an automatic parallel exposure system Model EXM-1350B available from ORC MANUFACTURING Co., Ltd. in place of a divisional projection exposure system Model UX-5038SC available from USHIO INC. using a photomask containing polyester as a base material. The sectional view of a capacitor 12 in Comparative Example 4 is shown in FIG. 10.

With respect to the multilayer wiring boards manufactured as described above, capacitor portions were cut out and cast with an epoxy resin, and substrate cross sections were polished. Shifts between counter electrodes of the capacitors and the area of the upper electrode of the capacitor were measured from the cross sections using a microscope with a scale (MX50 available from OLYMPUS Co., Ltd.). The number of measurement samples of each multilayer wiring board is 12 samples. The measurement results are shown in Table 3 and Table 4.

TABLE 3

| Item | | Shift of Counter Electrode (μm) | | |
|---|---|---|---|---|
| | | Maximum | Minimum | Average |
| Example | 10 | 39.4 | 2.2 | 13.1 |
| | 16 | 27.2 | 5.3 | 10.8 |
| | 17 | 40.8 | 7.0 | 16.4 |
| Comparative Example 4 | | 82.4 | 14.4 | 40.2 |

TABLE 4

| Item | | Area of Upper Electrode (mm$^2$) | | | |
|---|---|---|---|---|---|
| | | Maximum | Minimum | Average | Fluctuation (%) |
| Example | 10 | 0.756 | 0.743 | 0.747 | ±0.9 |
| | 18 | 0.755 | 0.743 | 0.749 | ±0.8 |
| | 19 | 0.760 | 0.742 | 0.751 | ±1.2 |
| Comparative Example 4 | | 0.771 | 0.733 | 0.754 | ±2.6 |

In Table 3, although shifts between the counter electrodes were less than 50 μm in Examples 10, 16, and 17, a shift between the counter electrodes was 80 μm or more in Comparative Example 4. In Table 4, although fluctuations of the upper electrodes were about ±1% in Examples 10, 18, and 19, a fluctuation of the upper was large, i.e., ±2.6% in Comparative Example 4. These results were obtained because the thicknesses of the capacitor electrodes were made thin in manufacture of the multilayer wiring boards of Examples 10 to 19 to reduce fluctuations in etching and because exposure was performed by a divisional exposure scheme using glass-based high-precision photomasks to form conductive patterns in manufacture of the multilayer wiring boards of Examples 10 to 19.

Fluctuations in capacitance of capacitors were calculated by calculations using the results in Table 3 and Table 4. The results are shown in Table 5.

TABLE 5

| Item | | Capacitance of Capacitor (pF) | | | |
|---|---|---|---|---|---|
| | | Maximum | Minimum | Average | Fluctuation (%) |
| Example | 10 | 15.02 | 14.15 | 14.84 | ±3.01 |
| | 11 | 15.09 | 14.69 | 14.92 | ±1.44 |
| | 12 | 15.12 | 14.85 | 14.94 | ±0.89 |
| | 13 | 15.13 | 14.87 | 15.01 | ±0.99 |
| | 14 | 15.12 | 14.86 | 14.99 | ±0.89 |
| | 15 | 15.10 | 14.84 | 14.97 | ±0.87 |
| | 16 | 15.04 | 14.16 | 14.60 | ±2.78 |
| | 17 | 15.00 | 14.08 | 14.44 | ±3.43 |
| | 18 | 15.00 | 14.16 | 14.58 | ±2.88 |
| | 19 | 14.99 | 13.98 | 14.49 | ±3.49 |
| Comparative Example | | 14.89 | 12.46 | 13.80 | ±8.82 |

As is apparent from Table 5, the fluctuations in capacitance of the capacitors in Examples 10 to 19 are smaller than the fluctuation in Comparative Example 4. Since no significant differences can be observed in Examples 12 to 14, it is understood that, in consideration of fluctuations in position in exposure of photosensitive resists, occupied areas of the capacitors can be small by designing the areas of the lower electrodes to the minimum and it is preferably. Since no significant difference can be observed in comparison between Example 12 using the subtract method and Example 15 using the semi-additive method, it is understood that a conductive pattern including a capacitor electrode can be preferably formed by the subtract method having an economical advantage.

As described above, according to the multilayer wiring board of the present invention, a high-dielectric material layer serving as a dielectric portion of a capacitor is reduced in thickness to make it possible to reduce warpage of the multilayer wiring board regardless of symmetry or asymmetry of a layer structure. Furthermore, since a capacitor can be built in an arbitrary layer except for a core layer, the degree of freedom of design can be considerably improved. Since the number of capacitors can be suppressed to the minimum number, the cost can be reduced. Since the high-dielectric material has a small thickness, a capacitance of capacitor which is in inverse proportion to the thickness of the dielectric can be increased.

A multilayer wiring board including a thin high-dielectric material, a capacitor having a small fluctuation in capacitance and no problem in moldability, and a manufacturing method of the same can be provided.

A semiconductor device in which a semiconductor chip is mounted on the multilayer wiring board having the above characteristic features and a wireless electronic device on which the semiconductor device is mounted can be provided.

It will be apparent to persons skilled in the art that the above is a preferable embodiment of the invention and that various changes and modifications can be executed without departing from the spirit and scope of the invention.

The invention claimed is:

1. A multilayer wiring board comprising a plurality of insulating layers, a plurality of conductive layers, a conductive non-through hole for electrically connecting the plurality of conductive layers to each other, and a capacitor produced by forming electrodes on upper and lower surfaces of at least one insulating layer containing a high-dielectric material, wherein the capacitor is in an arbitrary layer except for a core layer and a layer structure is asymmetrical, a warpage is $4.0 \times 10^{-4}$ mm$^{-1}$ or less in curvature at a room temperature, and a hardened material of the high-dielectric material has a specific inductive capacity ranging from 20 to 100 at 25° C., 1 MHz and a thickness ranging from 0.1 to 30 μm.

2. The multilayer wiring board according to claim 1, wherein the capacitor is in an arbitrary layer except for a core layer and a layer structure is asymmetrical, and a warpage is 1 mm or less.

3. A multilayer wiring board comprising a plurality of insulating layers, a plurality of conductive layers, a conductive non-through hole for electrically connecting the plurality of conductive layers to each other, and a capacitor produced by forming electrodes on upper and lower surfaces of at least one insulating layer containing a high-dielectric material, wherein an insulating material different from the high-dielectric material is filled in a recessed portion between conductive patterns including the electrodes, and the surfaces of the conductive patterns and the surface of the filled insulating material are planarized.

4. The multilayer wiring board according to claim 3, wherein the conductive pattern including at least one of the electrodes is in contact with different insulating materials of three types including the high-dielectric material.

5. A multilayer wiring board comprising a plurality of insulating layers, a plurality of conductive layers, a conductive hole for electrically connecting the plurality of conductive layers to each other, and a capacitor comprising at least one of the insulating layers containing a high-dielectric material having a specific inductive capacity ranging from 20 to 100 at 25° C., 1 MHz and produced by forming electrodes on upper and lower surfaces of the insulating layer, wherein at least one side of the counter electrodes has a thickness ranging from 1 to 18 μm and is arranged inside an outer periphery of the electrode opposing the electrode having the thickness.

6. The multilayer wiring board according to claim 5, wherein a minimum horizontal distance between each side surface of the electrode having the thickness ranging from 1 to 18 μm and each side surface of the electrode opposing it are respectively ranging from 50 to 100 μm.

7. The multilayer wiring board according to claim 5, wherein a minimum horizontal distance between each side surface of the electrode having the thickness ranging from 1 to 18 μm and an outer edge of the conductive hole formed on the electrode for electrically connecting arbitrary conductive layers are respectively 100 μm or more.

8. The multilayer wiring board according to claim 5, wherein the electrode having the thickness ranging from 1 to 18 μm is formed by etching and removing an unnecessary portion of a conductive layer.

9. The multilayer wiring board according to claim 3, wherein the capacitor is in an arbitrary layer except for a core layer, and a fluctuation in capacitance of the capacitor is less than ±5%.

10. The multilayer wiring board according to claim 1, comprising an inductor formed by patterning at least one conductive layer.

11. The multilayer wiring board according to claim 10, wherein a thickness of the conductive layer in which the inductor is formed is smaller than a thickness of another conductive layer and ranges from 1 to 12 μm.

12. The multilayer wiring board according to claim 10, wherein the inductor is manufactured on any one of the electrodes formed on the upper and lower surfaces of the insulating layer.

13. The multilayer wiring board according to claim 1, comprising a non-through hole which simultaneously penetrates at least one of the insulating layer containing the high-dielectric material and another insulating layer adjacent to the insulating layer containing the high-dielectric material.

14. The multilayer wiring board according to claim 1, wherein the high-dielectric material contains an epoxy resin, a hardening agent for the epoxy resin, and a high-dielectric material filler.

15. The multilayer wiring board according to claim 1, wherein the high-dielectric material contains an epoxy resin, a hardening agent for the epoxy resin, a high-dielectric material filler, and a high-molecular-weight resin having at least one functional group and a weight-average molecular weight ranging from 10000 to 800000.

16. The multilayer wiring board according to claim 1, wherein a melting viscosity of the high-dielectric material in a B-stage state at 120° C. preferably ranges from 100 to 200 Pa·S.

17. The multilayer wiring board according to claim 14, wherein the high-dielectric material filler is at least one selected from the group consisting of barium titanate, strontium titanate, calcium titanate, magnesium titanate, lead titanate, titanium dioxide, barium zirconate, and calcium zirconate, lead zirconate.

18. The multilayer wiring board according to claim 14, wherein the high-dielectric filler is compounded 300 to 3000 parts by weight to the epoxy resin of 100 parts by weight.

19. The multilayer wiring board according to claim 1, wherein, as an outermost conductive layer, at least one conductive pattern having a width of 300 μm or more is formed, and a thickness of an insulating layer adjacent to the outermost conductive layer is 150 μm or more.

20. The multilayer wiring board according to claim 1, wherein an insulating layer except for at least one of the insulating layers containing the high-dielectric material is reinforced by a glass substrate and contains an inorganic filler.

21. The multilayer wiring board according to claim 1, wherein the electrodes formed on the upper and lower surfaces of the insulating layer are formed so that one surface or both the surfaces of the insulating layer may not be entirely covered.

22. A semiconductor device wherein a semiconductor chip is mounted on a multilayer wiring board according to claim 1.

23. A wireless electronic device wherein a semiconductor device according to claim 22 is mounted.

24. The multilayer wiring board according to claim 6, wherein a minimum horizontal distance between each side surface of the electrode having the thickness ranging from 1 to 18 μm and an outer edge of the conductive hole formed on the electrode for electrically connecting arbitrary conductive layers are respectively 100 μm or more.

25. The multilayer wiring board according to claim 6, wherein the electrode having the thickness ranging from 1 to 18 μm is formed by etching and removing an unnecessary portion of a conductive layer.

26. The multilayer wiring board according to claim 7, wherein the electrode having the thickness ranging from 1 to 18 μm is formed by etching and removing an unnecessary portion of a conductive layer.

27. The multilayer wiring board according to claim 5, wherein the capacitor is in an arbitrary layer except for a core layer, and a fluctuation in capacitance of the capacitor is less than ±5%.

28. The multilayer wiring board according to claim 3, comprising an inductor formed by patterning at least one conductive layer.

29. The multilayer wiring board according to claim 5, comprising an inductor formed by patterning at least one conductive layer.

30. The multilayer wiring board according to claim 3, comprising a non-through hole which simultaneously penetrates at least one of the insulating layer containing the high-dielectric material and another insulating layer adjacent to the insulating layer containing the high-dielectric material.

31. The multilayer wiring board according to claim 5, comprising a non-through hole which simultaneously penetrates at least one of the insulating layer containing the high-dielectric material and another insulating layer adjacent to the insulating layer containing the high-dielectric material.

32. The multilayer wiring board according to claim 3, wherein the high-dielectric material contains an epoxy resin, a hardening agent for the epoxy resin, and a high-dielectric material filler.

33. The multilayer wiring board according to claim 5, wherein the high-dielectric material contains an epoxy resin, a hardening agent for the epoxy resin, and a high-dielectric material filler.

34. The multilayer wiring board according to claim 3, wherein the high-dielectric material contains an epoxy resin, a hardening agent for the epoxy resin, a high-dielectric material filler, and a high-molecular-weight resin having at least one functional group and a weight-average molecular weight ranging from 10000 to 800000.

35. The multilayer wiring board according to claim 5, wherein the high-dielectric material contains an epoxy resin, a hardening agent for the epoxy resin, a high-dielectric material filler, and a high-molecular-weight resin having at least one functional group and a weight-average molecular weight ranging from 10000 to 800000.

36. The multilayer wiring board according to claim 3, wherein a melting viscosity of the high-dielectric material in a B-stage state at 120° C. preferably ranges from 100 to 200 Pa·S.

37. The multilayer wiring board according to claim 5, wherein a melting viscosity of the high-dielectric material in a B-stage state at 120° C. preferably ranges from 100 to 200 Pa·S.

38. The multilayer wiring board according to claim 3, wherein, as an outermost conductive layer, at least one conductive pattern having a width of 300 μm or more is formed, and a thickness of an insulating layer adjacent to the outermost conductive layer is 150 μm or more.

39. The multilayer wiring board according to claim 5, wherein, as an outermost conductive layer, at least one conductive pattern having a width of 300 μm or more is formed, and a thickness of an insulating layer adjacent to the outermost conductive layer is 150 μm or more.

40. The multilayer wiring board according to claim 3, wherein an insulating layer except for at least one of the insulating layers containing the high-dielectric material is reinforced by a glass substrate and contains an inorganic filler.

41. The multilayer wiring board according to claim 5, wherein an insulating layer except for at least one of the insulating layers containing the high-dielectric material is reinforced by a glass substrate and contains an inorganic filler.

42. The multilayer wiring board according to claim 3, wherein the electrodes formed on the upper and lower surfaces of the insulating layer are formed so that one surface or both the surfaces of the insulating layer may not be entirely covered.

43. The multilayer wiring board according to claim 5, wherein the electrodes formed on the upper and lower surfaces of the insulating layer are formed so that one surface or both the surfaces of the insulating layer may not be entirely covered.

44. A semiconductor device wherein a semiconductor chip is mounted on a multilayer wiring board according to claim 3.

45. A wireless electronic device wherein a semiconductor device according to claim 44 is mounted.

46. A semiconductor device wherein a semiconductor chip is mounted on a multilayer wiring board according to claim 5.

47. A wireless electronic device wherein a semiconductor device according to claim 46 is mounted.

* * * * *